(12) United States Patent
Hosoda

(10) Patent No.: US 10,976,664 B2
(45) Date of Patent: Apr. 13, 2021

(54) TARGET IMAGE CAPTURING DEVICE AND EXTREME ULTRAVIOLET LIGHT GENERATION DEVICE

(71) Applicant: Gigaphoton Inc., Tochigi (JP)

(72) Inventor: Hirokazu Hosoda, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 16/389,867

(22) Filed: Apr. 19, 2019

(65) Prior Publication Data

US 2019/0250517 A1    Aug. 15, 2019

Related U.S. Application Data

(63) Continuation of application No. PCT/JP2016/089153, filed on Dec. 28, 2016.

(51) Int. Cl.
  *G03F 7/20* (2006.01)
  *H04N 5/225* (2006.01)
  *H05G 2/00* (2006.01)

(52) U.S. Cl.
  CPC ............ *G03F 7/70033* (2013.01); *G03F 7/20* (2013.01); *H04N 5/2256* (2013.01); *H05G 2/008* (2013.01)

(58) Field of Classification Search
  USPC ...................................................... 250/504 R
  See application file for complete search history.

(56) References Cited

U.S. PATENT DOCUMENTS

| 5,909,244 | A | * | 6/1999 | Waxman | ................ H04N 5/335 348/222.1 |
| 6,341,183 | B1 | * | 1/2002 | Goldberg | ................ G06F 3/005 382/276 |
| 6,941,005 | B2 | * | 9/2005 | Lary | ................. G01N 15/1425 356/317 |

(Continued)

FOREIGN PATENT DOCUMENTS

| JP | H11-105307 A | 4/1999 |
| JP | 2001-242503 A | 9/2001 |

(Continued)

OTHER PUBLICATIONS

International Search Report issued in PCT/JP2016/089153; dated Mar. 7, 2017.

(Continued)

*Primary Examiner* — Phillip A Johnston
(74) *Attorney, Agent, or Firm* — Studebaker & Brackett PC

(57) ABSTRACT

A target image capturing device according to an aspect of the present disclosure includes: a delay circuit configured to receive a timing signal from outside and output a first trigger signal at a timing delayed by a first delay time from the reception of the timing signal; an illumination light source configured to emit light based on the first trigger signal; an image capturing unit disposed to capture an image of a shadow of a target to be observed, which is generated when the target is irradiated with the light emitted from the illumination light source; a processing unit configured to perform image processing including processing of measuring a background luminance from the image captured by the image capturing unit; and a control unit configured to perform control to adjust the first delay time based on the background luminance.

20 Claims, 26 Drawing Sheets

(56) References Cited

U.S. PATENT DOCUMENTS

| | | | | |
|---|---|---|---|---|
| 7,394,083 | B2* | 7/2008 | Bowering | B82Y 10/00 |
| | | | | 250/396 R |
| 9,986,629 | B2* | 5/2018 | Suzuki | H05G 2/005 |
| 2014/0111635 | A1 | 4/2014 | Suzuki et al. | |
| 2015/0351211 | A1 | 12/2015 | Mizoguchi et al. | |
| 2016/0234920 | A1 | 8/2016 | Suzuki et al. | |

FOREIGN PATENT DOCUMENTS

| | | |
|---|---|---|
| JP | 2009-012206 A | 1/2009 |
| JP | 2009-104924 A | 5/2009 |
| JP | 2014-086523 A | 5/2014 |
| JP | 2015-524599 A | 8/2015 |
| WO | 2014-006193 A1 | 1/2014 |
| WO | 2014/147901 A1 | 9/2014 |
| WO | 2015/041260 A1 | 3/2015 |

OTHER PUBLICATIONS

International Preliminary Report on Patentability and Written Opinion issued in PCT/JP2016/089153; dated Jul. 2, 2019.

An Office Action mailed by the Japanese Patent Office dated May 28, 2020, which corresponds to Japanese Patent Application No. 2018-558620 and is related to U.S. Appl. No. 16/389,867; with English language translation.

\* cited by examiner

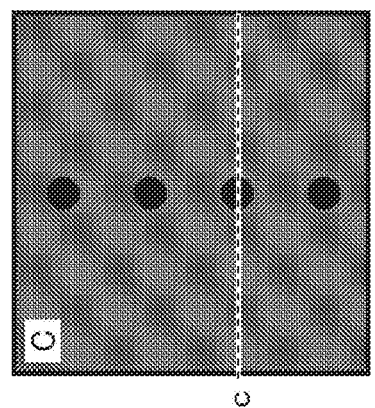
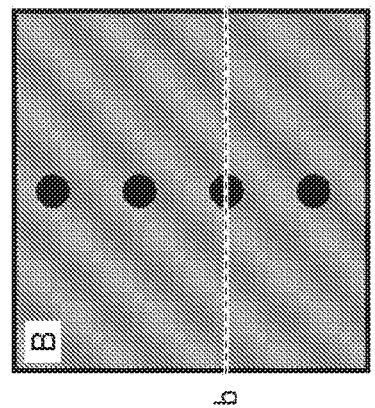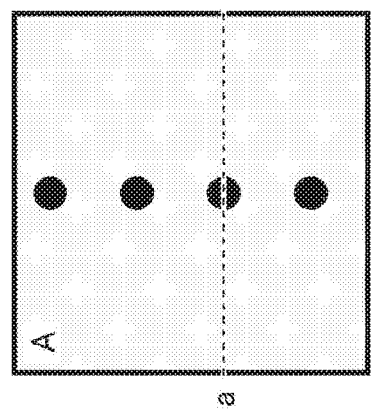
Fig. 9

Fig. 24

|  | BACKGROUND LUMINANCE ACQUISITION | | | | |
|---|---|---|---|---|---|
|  | a | b | c | d | e |
| PROCESSING COMPLICATION | A | A | B | B | B |
| PROCESSING RANGE | B | B | B | A | A |
| TARGET IMAGE INFLUENCE | B | A | A | B | A |
| (THERMAL) NOISE INFLUENCE | A | B | A | A | A |

TARGET IMAGE CAPTURING DEVICE AND EXTREME ULTRAVIOLET LIGHT GENERATION DEVICE

CROSS-REFERENCE TO RELATED APPLICATIONS

The present application is a continuation application of International Application No. PCT/JP2016/089153 filed on Dec. 28, 2016. The content of the application is incorporated herein by reference in its entirety.

BACKGROUND

1. Technical Field

The present disclosure relates to a target image capturing device and an extreme ultraviolet light generation device.

2. Related Art

Recently, miniaturization of a transfer pattern in optical lithography of a semiconductor process has been rapidly proceeding along with miniaturization of the semiconductor process. Minute fabrication at 20 nm or smaller will be requested in the next generation technology. To meet the request for minute fabrication at 20 nm or smaller, for example, it is desired to develop an exposure device including an extreme ultraviolet light generation device configured to generate extreme ultraviolet (EUV) light at a wavelength of 13.5 nm in combination with reduced projection reflective optics.

Disclosed EUV light generation devices include three kinds of devices, or a laser produced plasma (LPP) device that uses plasma generated by irradiating a target material with a laser beam, a discharge produced plasma (DPP) device that uses plasma generated by electrical discharge, and a synchrotron radiation (SR) device that uses synchrotron radiation.

LIST OF DOCUMENTS

Patent Documents

Patent Document 1: Japanese Unexamined Patent Application Publication No. 2001-242503

SUMMARY

A target image capturing device according to an aspect of the present disclosure includes: a delay circuit configured to receive a timing signal from outside and output a first trigger signal at a timing delayed by a first delay time from the reception of the timing signal; an illumination light source configured to emit light based on the first trigger signal; an image capturing unit disposed to capture an image of a shadow of a target to be observed, which is generated when the target is irradiated with the light emitted from the illumination light source; a processing unit configured to perform image processing including processing of measuring a background luminance from the image captured by the image capturing unit; and a control unit configured to perform control to adjust the first delay time based on the background luminance.

An extreme ultraviolet light generation device according to another aspect of the present disclosure includes: a chamber in which plasma is generated; a target supply unit configured to supply, into the chamber, a target from which plasma is generated; a target passing detection device configured to detect passing of the target supplied from the target supply unit into the chamber and output a target passing detection signal; a delay circuit configured to receive the target passing detection signal and output a first trigger signal at a timing delayed by a first delay time from the reception of the target passing detection signal; an illumination light source configured to emit light based on the first trigger signal; an image capturing unit disposed at the chamber to capture an image of a shadow of a target to be observed, which is generated when the target is irradiated with the light emitted from the illumination light source; a processing unit configured to perform image processing including processing of measuring a background luminance from the image captured by the image capturing unit; and a control unit configured to perform control to adjust the first delay time based on the background luminance. Extreme ultraviolet light is generated by irradiating the target supplied from the target supply unit into the chamber with a laser beam to generate plasma from the target.

BRIEF DESCRIPTION OF THE DRAWINGS

Embodiments of the present disclosure will be described below as examples with reference to the accompanying drawings.

FIG. 9 is a schematic diagram of images captured by an image sensor in accordance with the light emission state of the flash lamp.

FIG. 24 is a diagram listing advantages and disadvantageous of Background Luminance Acquisition "a" to "e".

EMBODIMENTS

Table of Contents
1. Overall description of extreme ultraviolet light generation system
   1.1 Configuration
   1.2 Operation
2. Terms
3. EUV light generation device including target image capturing device
   3.1 Configuration
   3.2 Operation
4. Disposition of flash lamp
   4.1 First exemplary configuration
   4.2 Operation
   4.3 Second exemplary configuration
   4.4 Operation
5. Triggers of target image measurement device
6. Problems
   6.1 First problem 6.2 Second problem
7. First Embodiment
   7.1 Configuration
   7.2 Operation
   7.3 $T_{FL}$ adjustment execution timing
   7.4 Exemplary $T_{FL}$ adjustment processing algorithm
   7.5 Effects
8. Second Embodiment
   8.1 Configuration
   8.2 Operation
   8.3 Effects
9. Diffused target measurement Embodiments of the present disclosure will be described below in detail with reference to the accompanying drawings.

The embodiments described below are examples of the present disclosure, and do not limit the contents of the present disclosure. Not all Configurations and Operations described in each embodiment are necessarily essential as Configurations and Operations of the present disclosure. Components identical to each other are denoted by an identical Reference Sign, and duplicate description thereof will be omitted.

Figure 1:
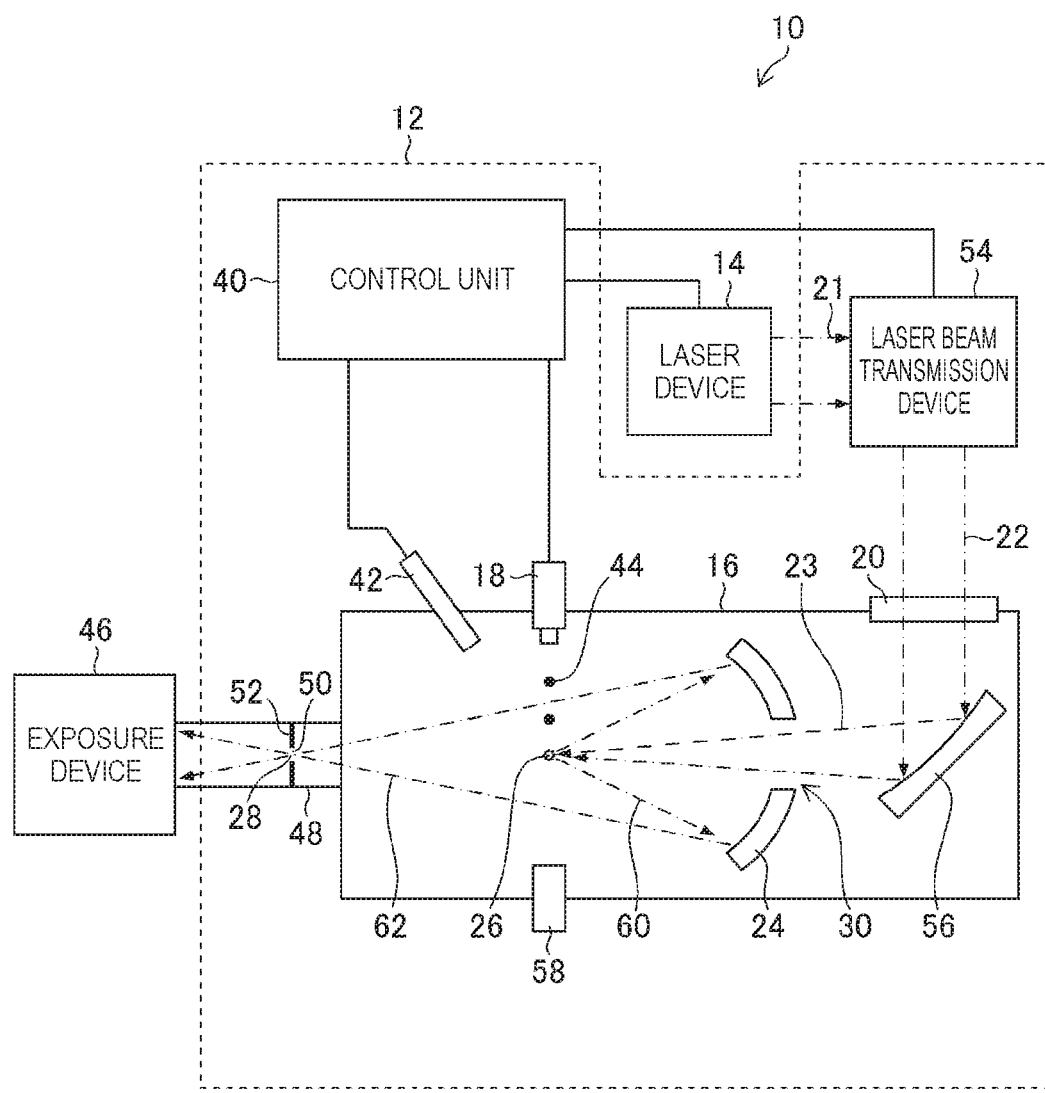
FIG. 1 is a diagram schematically illustrating the configuration of an exemplary LPP EUV light generation system.

1. Overall Description of Extreme Ultraviolet Light Generation System 1.1 Configuration FIG. 1 schematically illustrates the configuration of an exemplary LPP EUV light generation system 10. An EUV light generation device 12 is used together with at least one laser device 14 in some cases. In the present application, a system including the EUV light generation device 12 and the laser device 14 is referred to as the EUV light generation system 10. As illustrated in FIG. 1 and as described below in detail, the EUV light generation device 12 includes a chamber 16 and a target supply unit 18.

The chamber 16 is a sealable container. The target supply unit 18 supplies a target material into the chamber 16, and is, for example, attached to penetrate through a wall of the chamber 16. The target material may be made of tin, terbium, gadolinium, lithium, xenon, or a combination of any two or more of these materials, but is not limited thereto.

The wall of the chamber 16 is provided with at least one through-hole. The through-hole is blocked by a window 20 through which a pulse laser beam 22 output from the laser device 14 transmits. For example, an EUV light condensation mirror 24 having a spheroidal reflective surface is disposed inside the chamber 16. The EUV light condensation mirror 24 has a first focal point and a second focal point. For example, a multi-layer reflective film obtained by alternately stacking molybdenum and silicon is formed on the surface of the EUV light condensation mirror 24. For example, the EUV light condensation mirror 24 is disposed so that the first focal point is positioned in a plasma generation region 26 and the second focal point is positioned at an intermediate focusing point (IF) 28. The EUV light condensation mirror 24 is provided with a through-hole 30 at a central part thereof through which a pulse laser beam 23 passes.

The EUV light generation device 12 includes a control unit 40, a target sensor 42, and the like. The target sensor 42 detects any one or a plurality of the existence, locus, position, and speed of a target 44. The target sensor 42 may have an image capturing function.

The EUV light generation device 12 includes a connection unit 48 through which the inside of the chamber 16 and the inside of an exposure device 46 are communicated with each other. A wall 52 on which an aperture 50 is formed is provided inside the connection unit 48. The wall 52 is disposed so that the aperture 50 is positioned at the second focal point of the EUV light condensation mirror 24.

In addition, the EUV light generation device 12 includes a laser beam transmission device 54, a laser beam condensation mirror 56, and a target collection unit 58 for collecting the target 44, and the like. The laser beam transmission device 54 includes an optical element for defining the transmission state of a laser beam, and an actuator for adjusting the position, posture, and the like of the optical element. The target collection unit 58 is disposed on the extended line of a direction in which the target 44 output into the chamber 16 travels.

The laser device 14 may be a master oscillator power amplifier (MOPA) system. The laser device 14 may include a master oscillator (not illustrated), a light isolator (not illustrated), and a plurality of $CO_2$ laser amplifiers (not illustrated). The master oscillator may be a solid-state laser. The wavelength of a laser beam output from the master oscillator is, for example, 10.59 μm, and the repetition frequency of pulse oscillation is, for example, 100 kHz.

1.2 Operation

The following describes the operation of the exemplary LPP EUV light generation system 10 with reference to FIG. 1. A pulse laser beam 21 output from the laser device 14 passes through the laser beam transmission device 54 and is incident in the chamber 16 through the window 20 as the pulse laser beam 22. The pulse laser beam 22 travels inside the chamber 16 along at least one laser beam path, and is reflected by the laser beam condensation mirror 56 and incident on the at least one target 44 as the pulse laser beam 23.

The target supply unit 18 outputs the target 44 formed of the target material toward the plasma generation region 26 inside the chamber 16. The target 44 is irradiated with at least one pulse included in the pulse laser beam 23. Plasma is generated when the target 44 is irradiated with the pulse laser beam, and radiates radiation light 60. EUV light 62 included in the radiation light 60 is selectively reflected by the EUV light condensation mirror 24. The EUV light 62 reflected by the EUV light condensation mirror 24 is condensed at an intermediate focusing point 28 and output to the exposure device 46. The single target 44 may be irradiated with a plurality of pulses included in the pulse laser beam 23.

The control unit 40 controls the entire EUV light generation system 10. The control unit 40 processes a result of detection by the target sensor 42. The control unit 40 may control, based on the result of detection by the target sensor 42, for example, a timing at which the target 44 is output, a direction in which the target 44 is output, and the like. In addition, the control unit 40 may control, for example, the oscillation timing of the laser device 14, the traveling direction of the pulse laser beam 22, the condensation position of the pulse laser beam 23, and the like. These various kinds of control are merely exemplary, and may include other control as necessary.

In the present disclosure, the control unit 40 and any other control device can be achieved by hardware and software combination of one or a plurality of computers. The software is synonymous with a computer program. The computers conceptually include a programmable controller.

Functions of a plurality of control devices can be achieved by a single control device. In the present disclosure, the control unit 40 and the other control device may be connected with each other through a communication network including a local area network or the Internet. In a distributed computing environment, a program unit may be stored in local and remote memory storage devices.

2. Terms

"Pulse laser beam" may mean a laser beam containing a plurality of pulses.

"Laser beam" is not limited to a pulse laser beam, but may mean a general laser beam.

"Target" is an object irradiated with a laser beam introduced into the chamber. When irradiated with the laser beam, the target generates plasma and radiates EUV light.

"Droplet" is a form of the target supplied into the chamber. The droplet is synonymous with the target in the droplet form. The droplet may mean the target deformed into a substantially spherical shape due to the surface tension of the melted target material.

"Diffused target" means the target diffused into minute particles or the like when irradiated with the pulse laser beam. The minute particles of the target material are referred to as "mist" in some cases. The diffused target includes plasma in some cases. The diffused target (mist) is a form of the target.

"Plasma light" is radiation light radiated from the target as plasma. This radiation light includes EUV light.

"EUV light" stands for "extreme ultraviolet light".

Figure 2:
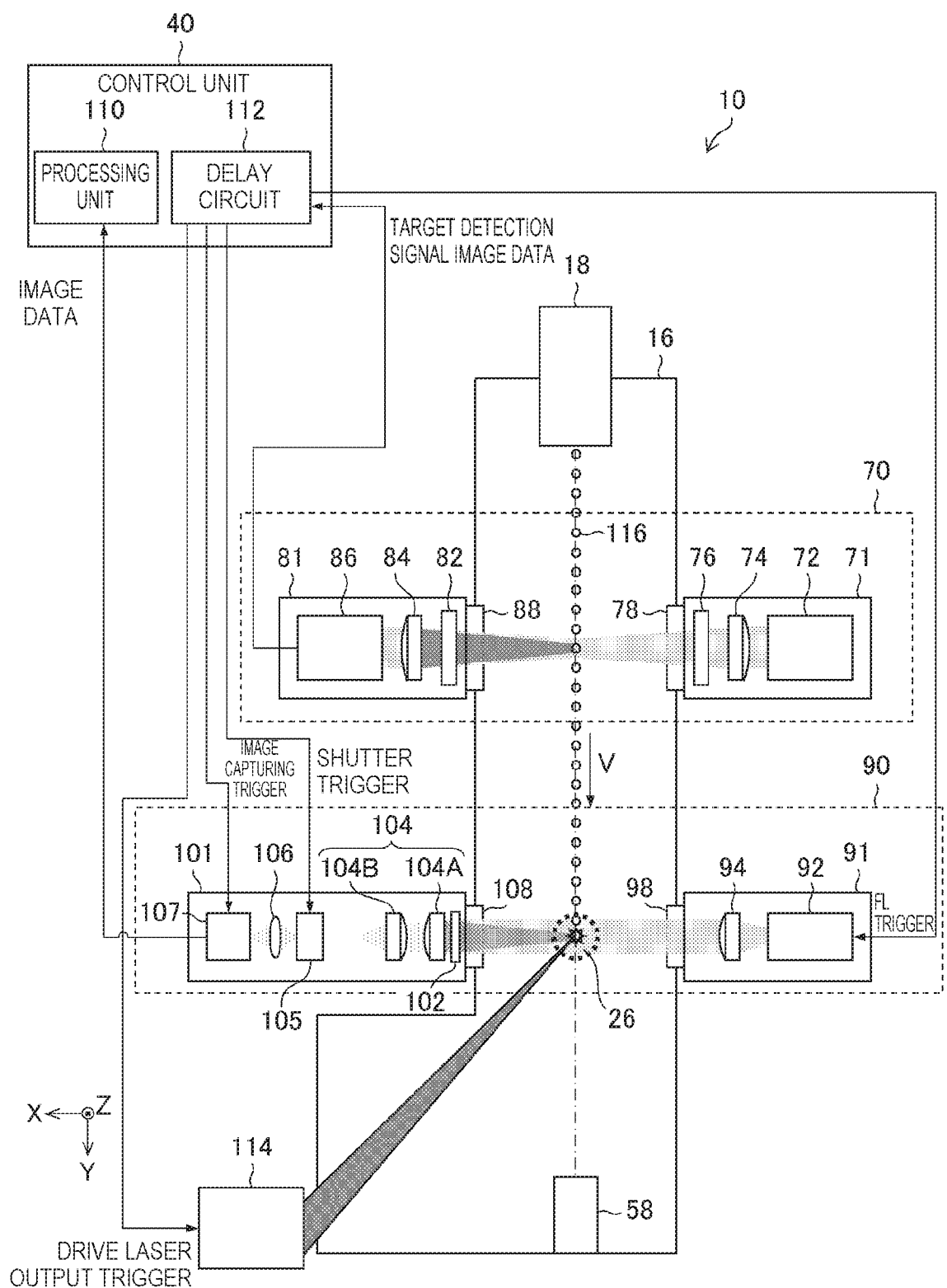
FIG. 2 is a diagram schematically illustrating the configuration of an EUV light generation device including a target image capturing device.

3. EUV Light Generation Device Including Target Image Capturing Device 3.1 Configuration FIG. 2 is a diagram schematically illustrating the configuration of the EUV light generation device including the target image capturing device. The EUV light generation device 12 includes a target passing detection device 70 and a target image measurement device 90. The target passing detection device 70 and the target image measurement device 90 are mounted on the chamber 16.

The target passing detection device 70 includes an illumination unit 71 and a measurement unit 81. The illumination unit 71 includes an illumination light source 72, an illumination optical system 74, and an optical filter 76. The illumination light source 72 may be a single-color light laser beam source or a lamp configured to emit light in a plurality of wavelengths. The illumination light source 72 may include an optical fiber connected with the illumination optical system 74. The illumination optical system 74 includes a light condensing lens. The illumination unit 71 is disposed outside of the chamber 16 through a window 78. The window 78 is attached to the wall of the chamber 16. The window 78 may be included as a component of the illumination optical system 74.

The measurement unit 81 includes an optical filter 82, a measurement optical system 84, and an optical sensor 86. The optical sensor 86 includes one or a plurality of light-receiving surfaces. The optical sensor 86 may be any one of a photodiode, a photodiode array, an avalanche photodiode, a photomultiplier, a multi-pixel photon counter, and an image intensifier. The optical sensor 86 outputs an electric signal in accordance with a received-light amount. The measurement optical system 84 includes a lens through which an image of the target illuminated with illumination light from the illumination light source 72 is transferred onto an element of the optical sensor 86.

The measurement unit 81 is disposed outside of the chamber 16 through a window 88. The window 88 is attached to the wall of the chamber 16 at a position opposite to the window 78. The window 88 may be included as a component of the measurement optical system 84. The illumination unit 71 and the measurement unit 81 are attached to the chamber 16 at positions opposite to each other with respect to a position through which the target passes.

The target image measurement device 90 includes an illumination unit 91 and a measurement unit 101. The illumination unit 91 includes a flash lamp 92 as an illumination light source and an illumination optical system 94. The illumination unit 91 is disposed outside of the chamber 16 through a window 98. The window 98 is attached to the wall of the chamber 16. The illumination optical system 94 includes a collimate lens.

The measurement unit 101 includes an optical filter 102, an imaging optical system 104, a shutter 105, a transfer optical system 106, and an image sensor 107. The image sensor 107 may be, for example, a charge-coupled device (CCD) image sensor. The measurement unit 101 is disposed outside of the chamber 16 through a window 108. The window 108 is attached to the wall of the chamber 16 at a position opposite to the window 98. The illumination unit 91 and the measurement unit 101 are attached to the chamber 16 at positions opposite to each other with respect to a position through which the target passes.

The window 98 functions as a light emission port through which light emitted from the flash lamp 92 is emitted toward the target. The window 98 corresponds to a form of "first window". The window 108 functions as a light incident port through which the light having passed nearby the target is introduced to the measurement unit 101. The window 108 corresponds to a form of "second window".

The control unit 40 includes a processing unit 110 and a delay circuit 112. The processing unit 110 processes image data of an image captured by the image sensor 107. The delay circuit 112 receives a target passing detection signal from the target passing detection device 70, and generates various trigger signals of an FL trigger, a shutter trigger, an image capturing trigger, and a drive laser output trigger based on the reception of the target passing detection signal. FL stands for "flash lamp".

The direction in which the window 98 of the illumination unit 91 and the window 108 of the measurement unit 101 are opposite to each other may or may not be orthogonal to a droplet trajectory as the traveling path of a droplet.

The EUV light generation device 12 is used together with a drive laser generation unit 114. The drive laser generation unit 114 corresponds to a configuration including the laser device 14 and the laser beam transmission device 54 described with reference to FIG. 1. FIG. 2 omits illustration of the laser beam transmission device 54, the laser beam condensation mirror 56, the EUV light condensation mirror 24, and the like illustrated in FIG. 1. The drive laser generation unit 114 may include a plurality of laser devices. The drive laser generation unit 114 of the present example includes a pre-pulse laser device and a main pulse laser device (not illustrated).

The chamber 16 is provided with a gas discharge device (not illustrated) and a pressure sensor (not illustrated). The chamber 16 is connected with a gas supply device (not illustrated).

Although not illustrated in detail, the target supply unit 18 includes a tank (not illustrated) storing the target material, a nozzle including a nozzle hole through which the target material is output, and a piezoelectric element (not illustrated) disposed at the nozzle. In addition, a heater (not illustrated) and a temperature sensor (not illustrated) are disposed at an outer side surface part of the tank. The EUV light generation device 12 also includes a pressure adjuster (not illustrated) configured to adjust the pressure in the tank storing the target material. The nozzle of the target supply unit 18 has a shape with which the target material being melted is ejected in a jet form into the chamber 16. The target material output through the nozzle hole is, for example, liquid tin. The plasma generation region 26 inside the chamber 16 is positioned on the extended line of the central axial direction of the nozzle.

3.2 Operation

For the purpose of description of directions, XYZ orthogonal coordinate axes are introduced in FIG. 2. The direction of the Y axis is defined to be a direction in which a droplet of the target material is output from the target supply unit 18. The direction of the X axis is defined to be a direction in which EUV light is guided from the chamber 16 toward the exposure device 46 (refer to FIG. 1), and the direction of the Z axis is defined to be a direction orthogonal to the sheet of FIG. 2.

The control unit 40 controls discharge by the gas discharge device (not illustrated) and gas supply from the gas supply device based on a detected value of the pressure sensor (not illustrated) attached to the chamber 16 so that the pressure in the chamber 16 is in a predetermined range. The predetermined range of the pressure in the chamber 16 is, for example, a value between several pascals [Pa] and several hundred pascals [Pa].

The target supply unit 18 forms a droplet 116 by, for example, a continuous jet scheme. In the continuous jet scheme, the nozzle is vibrated to provide standing wave to the flow of the target material ejected in a jet form through the nozzle hole, thereby periodically separating the target material. The separated target material forms a free interface by the surface tension thereof, thereby forming the droplet 116.

The control unit 40 controls the heater attached to the tank of the target supply unit 18 to heat the target material in the tank to a predetermined temperature equal to or higher than the melting point thereof. When the target material is tin, the control unit 40 controls the heater to heat tin in the tank to a predetermined temperature in a temperature range of 250° C. to 290° C., which is equal to or higher than the melting point thereof, thereby achieving temperature adjustment of tin in the tank. The melting point of tin is 232° C. The control unit 40 controls the pressure adjuster so that the pressure in the tank is equal to a pressure at which a jet of liquid tin can be output at a predetermined speed through the nozzle hole.

Subsequently, the control unit 40 transmits a signal for supplying voltage having a predetermined waveform to the piezoelectric element to generate the droplet 116. The piezoelectric element vibrates when supplied with voltage having the predetermined waveform. As a result, a jet of melted tin output through the nozzle hole is provided with regular disturbance due to the vibration of the nozzle hole. Accordingly, the melted tin in the jet form is divided into the droplets 116, thereby generating the droplets 116 having uniform volumes.

The drive laser generation unit 114 includes the pre-pulse laser device configured to output a pre-pulse laser beam, and the main pulse laser device configured to output a main pulse laser beam. In the LPP EUV light generation device 12 in the present embodiment, the target in the droplet form is irradiated with the pre-pulse laser beam so that the target is diffused. After the diffused target is formed, the diffused target is irradiated with the main pulse laser beam. When the diffused target is irradiated with the main pulse laser beam in this manner, plasma can be efficiently generated from the target material. Accordingly, conversion efficiency (CE) from the energy of a pulse laser beam into the energy of EUV light can be improved.

The pre-pulse laser beam for forming the diffused target is short pulse light in which the pulse width of each pulse is shorter than one nanosecond [ns], preferably shorter than 500 picoseconds [ps], more preferably shorter than 50 picoseconds [ps]. Moreover, the fluence of each pulse of the pre-pulse laser beam is equal to or lower than the fluence of each pulse of the main pulse laser beam, and is equal to or higher than 6.5 J/cm$^2$, preferably equal to or higher than 30 J/cm$^2$, more preferably equal to or higher than 45 J/cm$^2$.

With this configuration, the target can be broken down into minute particles and diffused by shortening the pulse width of each pulse of the pre-pulse laser beam. Accordingly, when the target thus diffused is irradiated with the main pulse laser beam, plasma can be efficiently generated from the target, and the CE can be improved accordingly.

The target may be irradiated with a plurality of pre-pulse laser beams before the main pulse laser beam irradiation.

The target collection unit 58 collects the droplet 116 having passed through the plasma generation region 26 without being irradiated with the pulse laser beam 23, and part of the droplet not diffused through irradiation with the pulse laser beam 23.

The illumination unit 71 of the target passing detection device 70 illuminates the target introduced from the target supply unit 18 into the chamber 16. The intensity of light received by the measurement unit 81 decreases as the target passes through a predetermined position. The change in the light intensity along with the passing of the target is detected by the optical sensor 86. The optical sensor 86 outputs a target detection signal indicating the passing timing of the target to the control unit 40.

The control unit 40 generates the target passing detection signal when the target detection signal becomes lower than a predetermined threshold voltage. The target passing detection signal may be generated at the measurement unit 81 and output from the measurement unit 81 to the control unit 40. In other words, in the target passing detection device 70, the passing of the target may be detected by the optical sensor 86, and the target passing detection signal may be transmitted to the control unit 40.

The delay circuit 112 provides, to the received target passing detection signal, a delay time set in advance to each of the devices of the flash lamp 92, the shutter 105, the image sensor 107, and the drive laser generation unit 114, and outputs a trigger signal for the device. The delay time set to each of the devices of the flash lamp 92, the shutter 105, the image sensor 107, and the drive laser generation unit 114 is determined by subtracting, from a time until the target reaches a specified place in the plasma generation region 26, an internal delay time and a transmission time for the device that receives the trigger signal.

"FL trigger" refers to the trigger signal provided to the flash lamp 92. "Shutter trigger" refers to the trigger signal provided to the shutter 105. "Image capturing trigger" refers to the trigger signal provided to the image sensor 107. "Drive laser output trigger" refers to the trigger signal provided to the drive laser generation unit 114.

The delay circuit 112 functions to synchronize light emission of the flash lamp 92, opening operation of the shutter 105, and exposure (image capturing operation) of the image sensor 107. Specifically, the delay circuit 112 functions to cause, at a timing at which the flash lamp 92 emits light based on the FL trigger, the shutter 105 to open based on the shutter trigger, and the image sensor 107 to perform exposure based on the image capturing trigger.

As a result, the target image measurement device 90 captures an image of the target near the plasma generation region 26. Image data acquired through the image sensor 107 is transferred to the processing unit 110 of the control unit 40 and subjected to image processing at the processing unit 110.

4. Disposition of Flash Lamp

4.1 First Exemplary Configuration

Figure 3:
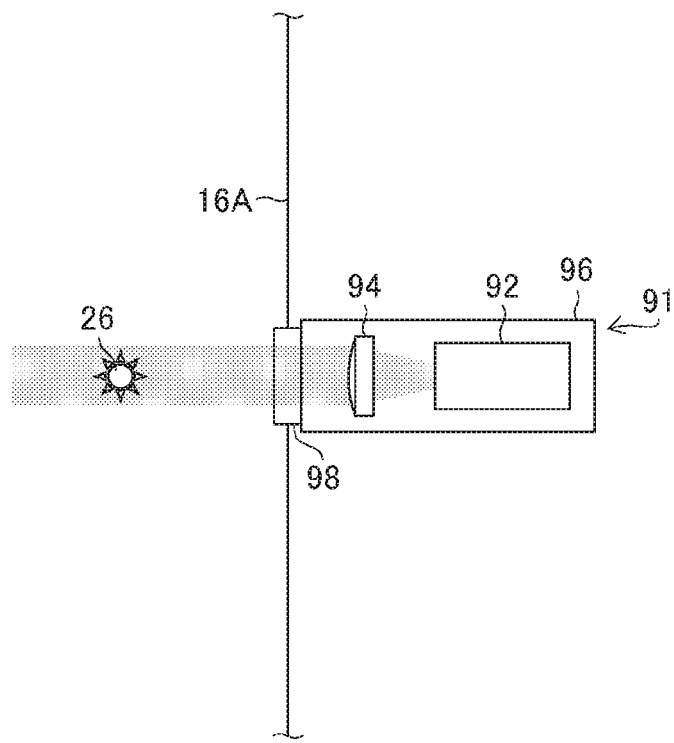
FIG. 3 is a diagram schematically illustrating a first exemplary configuration of an illumination unit in a target image measurement device.

FIG. 3 is a diagram schematically illustrating a first exemplary configuration of the illumination unit 91 in the target image measurement device 90. In the illumination unit 91 exemplarily illustrated in FIG. 3, the flash lamp 92 and the illumination optical system 94 are housed in a case 96 directly attached to a chamber wall 16A. The chamber wall 16A is part of the wall of the chamber 16.

4.2 Operation

As illustrated in FIG. 3, the flash lamp 92 is disposed near the illumination optical system 94. Illumination light emitted from the flash lamp 92, which is housed in the case 96 directly attached to the chamber wall 16A, is incident near the plasma generation region 26 through the illumination optical system 94 and the window 98.

4.3 Second Exemplary Configuration

Figure 4:
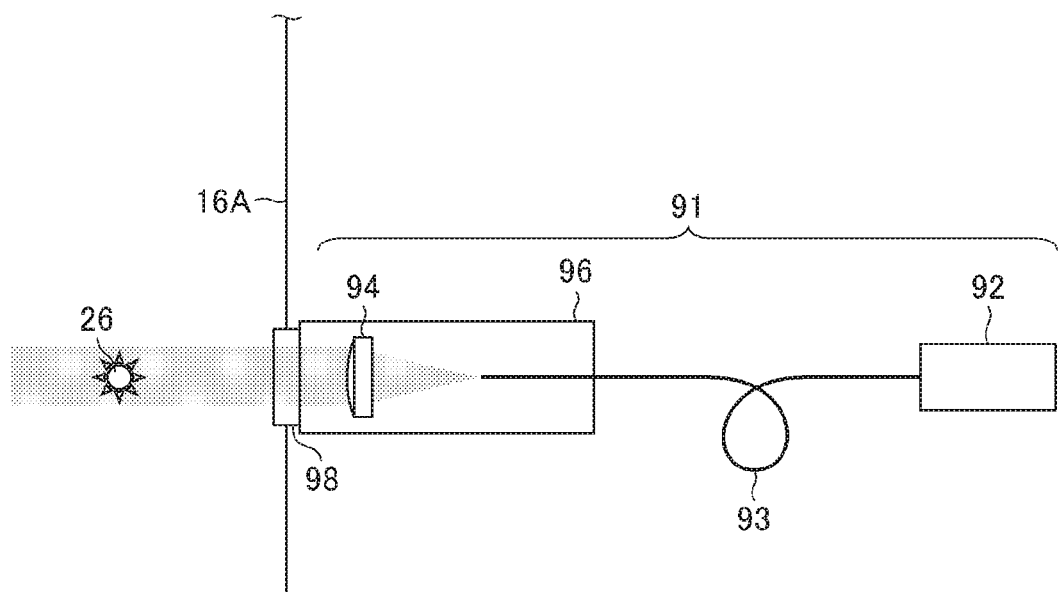
FIG. 4 is a diagram schematically illustrating a second exemplary configuration of the illumination unit in the target image measurement device.

FIG. 4 is a diagram illustrating a second exemplary configuration of the illumination unit 91 in the target image measurement device 90. The flash lamp 92 of the illumination unit 91 exemplarily illustrated in FIG. 4 is not disposed near the illumination optical system 94, but is disposed at a far place separated from the illumination optical system 94 by a sufficient distance. The illumination unit 91 includes an optical fiber 93 through which illumination light emitted from the flash lamp 92 is guided to the illumination optical system 94.

4.4 Operation

Illumination light emitted from the flash lamp 92 illustrated in FIG. 4 is transmitted to the illumination optical system 94 in the case 96 through the optical fiber 93. The illumination light is collimated by the illumination optical system 94 near the chamber through the optical fiber transmission, and incident near the plasma generation region 26. A mirror may be used in place of or in combination with the optical fiber 93 to form a light transmission optical path through which the illumination light is transmitted. As exemplarily illustrated in FIG. 4, the flash lamp 92 can be placed at a position separated from the chamber 16.

5. Triggers of Target Image Measurement Device

Figure 5:
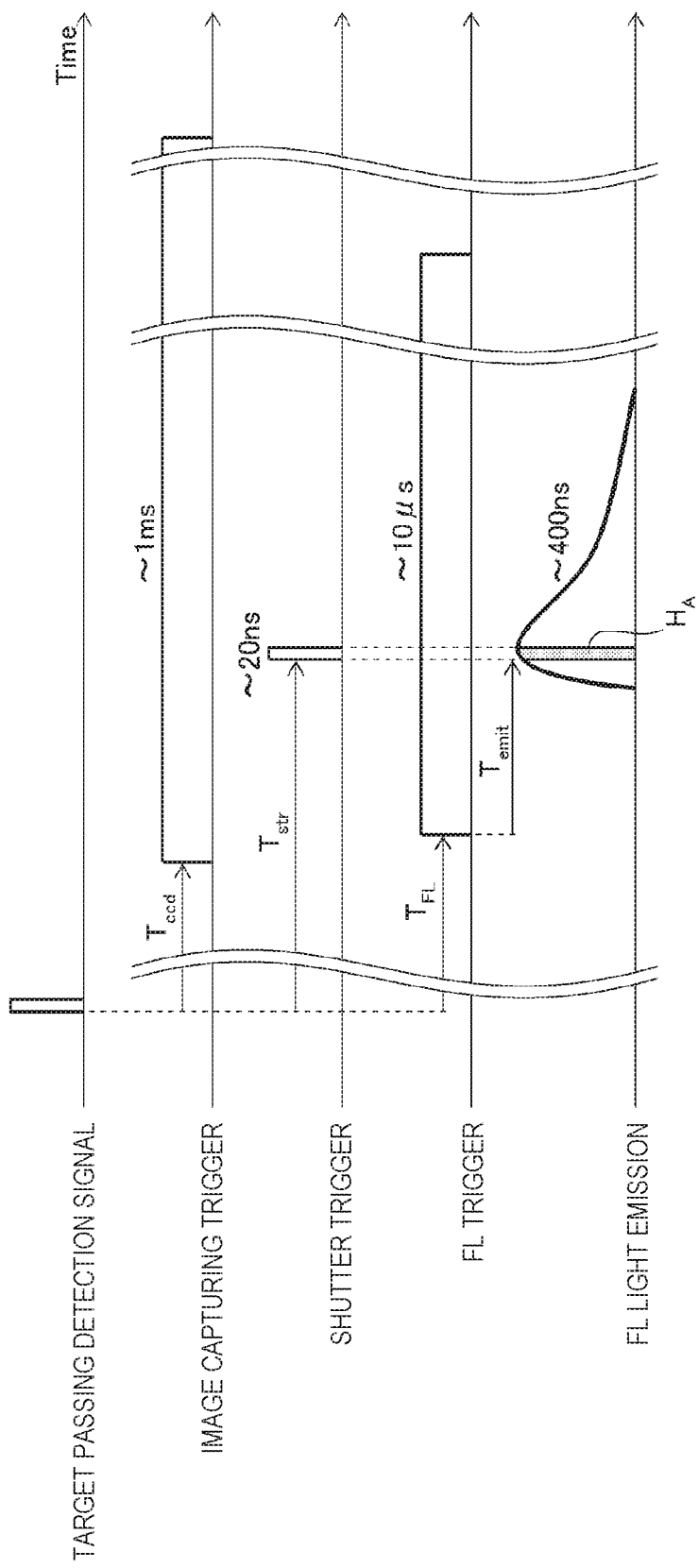
FIG. 5 is a timing chart of the target image measurement device.

FIG. 5 is a timing chart of the target image measurement device. The target passing detection signal is a timing signal as a reference for the timings of the trigger signals of the image capturing trigger, the shutter trigger, and the FL trigger. The delay circuit 112 outputs the trigger signals of the image capturing trigger, the shutter trigger, and the FL trigger at timings delayed by respective necessary delay times from the reception of the target passing detection signal.

The delay circuit 112 generates the image capturing trigger delayed by a delay time $T_{ccd}$ from the reception of the target passing detection signal, and transmits the image capturing trigger to the image sensor 107. The length of a time for which the image capturing trigger is on is, for example, one millisecond approximately.

The delay circuit 112 generates the shutter trigger delayed by a delay time $T_{str}$ from the reception of the target passing detection signal, and transmits the shutter trigger to the shutter 105. The length of a time for which the shutter trigger is on is, for example, 20 nanoseconds approximately. The delay circuit 112 generates the FL trigger delayed by a delay time $T_{FL}$ from the reception of the target passing detection signal, and transmits the FL trigger to the flash lamp 92. The length of a time for which the FL trigger is on is, for example, 10 microseconds approximately.

"FL light emission" in FIG. 5 corresponds to the light emission strength of the flash lamp 92 to which the FL trigger is input. The light emission strength of the flash lamp 92 indicates the luminance of illumination light due to flash light emission. The flash lamp 92 is a high-luminance pulse light source. The flash lamp 92 starts the light emission slightly delayed from the trigger inputting, and the light emission strength reaches a peak in a time $T_{emit}$ from the trigger inputting timing, and attenuates thereafter.

FIG. 5 illustrates an example in which the delay time $T_{FL}$ of the FL trigger is appropriately set. When the delay time $T_{FL}$ of the FL trigger is appropriately set, the timing of the light emission peak of the flash lamp 92 substantially coincides with the timing of the shutter trigger. In FIG. 5, the area (integration value) of a hatched part $H_A$ overlapping with the duration in which the shutter trigger is on in the FL light emission corresponds to the background luminance of an image captured by the image sensor 107.

6. Problems 6.1 First Problem

When the flash lamp 92 is used for a long duration, the time lag between trigger inputting to the flash lamp 92 and light emission therefrom changes due to wear of a discharging electrode, degradation of encapsulated gas, degradation of an electronic circuit component, and the like in the flash lamp 92.

Figure 6:
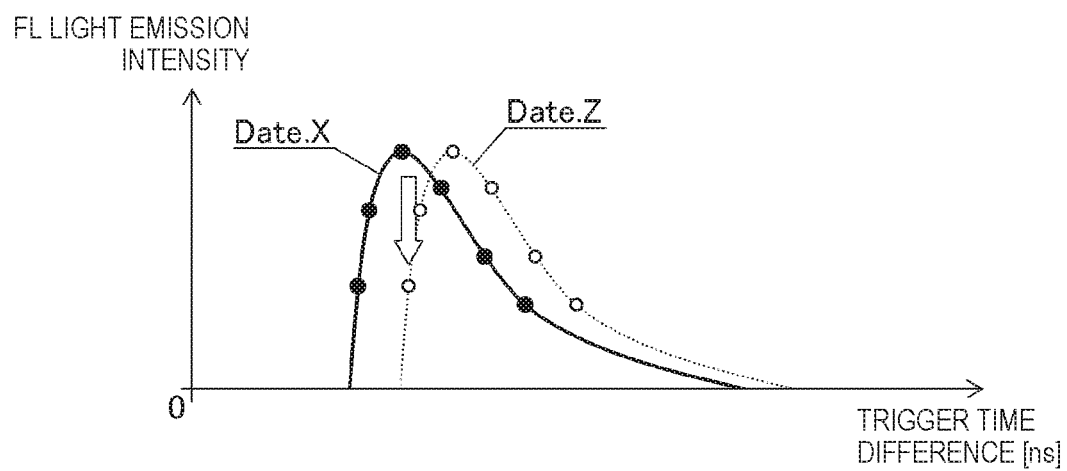
FIG. 6 is a graph exemplarily illustrating change in the light emission timing of a flash lamp.

FIG. 6 is a graph exemplarily illustrating change in the light emission timing of the flash lamp. The horizontal axis represents a time lag (elapsed time) from inputting of the FL trigger in units of nanoseconds [ns]. The horizontal axis has an origin at the trigger inputting. The vertical axis represents the light emission strength of the flash lamp. In FIG. 6, a light emission waveform denoted by Date.X represents the light emission state of the flash lamp measured at a particular date and time X. For example, the light emission waveform Date.X represents the initial performance of the flash lamp. In FIG. 6, a light emission waveform denoted by Date.Z represents the light emission state of the flash lamp measured at a particular date and time Z after a sufficiently long duration has elapsed since the date and time X. The time lag between the trigger inputting and light emission from the flash lamp 92 increases as the flash lamp 92 is used for a longer duration.

Conventionally, at an initial stage of the start of device use, the timing of trigger inputting to the flash lamp 92 is adjusted to synchronize with the exposure timing of an image capturing system in the measurement unit 101, in other words, to maximize an integrated light amount (background light amount of a captured image) over the exposure time. Then, the timing of trigger inputting to the flash lamp 92 is not adjusted thereafter.

Thus, the light amount of illumination light incident in the duration in which the shutter trigger is on decreases when the light emission waveform Date.X changes to the light emission waveform Date.Z after the device is set so that the timing of a light emission peak of the light emission waveform Date.X substantially coincides with the timing of the shutter trigger.

In other words, the synchronization with the exposure timing of the image capturing system is lost as the time between the trigger inputting and light emission from the flash lamp 92 changes due to aging or state change of the flash lamp 92.

Figure 7:
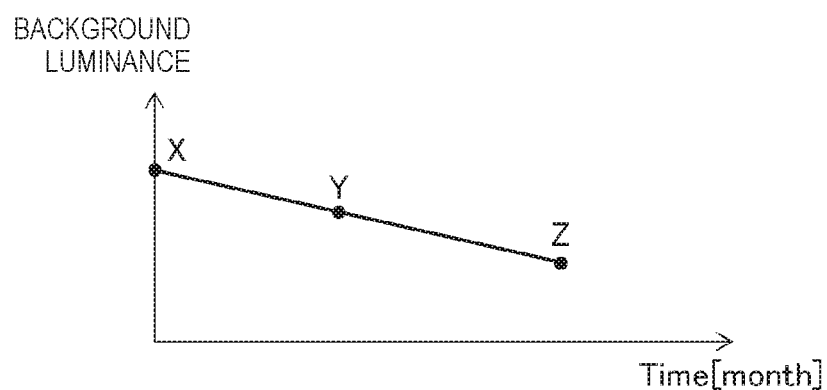
FIG. 7 is a graph illustrating a situation in which the background luminance of a captured image decreases due to aging, state change, or the like of the flash lamp.

FIG. 7 is a graph illustrating a situation in which the background luminance of a captured image decreases due to aging, state change, or the like of the flash lamp 92. In FIG. 7, the horizontal axis represents time in units of months. The vertical axis represents the background luminance. In FIG. 7, "X" corresponds to the date Date.X in FIG. 6, and "Z" corresponds to the date Date.Z in FIG. 6. In FIG. 7 "Y" corresponds to a particular date between "X" and "Z". As illustrated in FIG. 7, the background luminance decreases as the flash lamp 92 is used for a longer duration.

Figure 8:
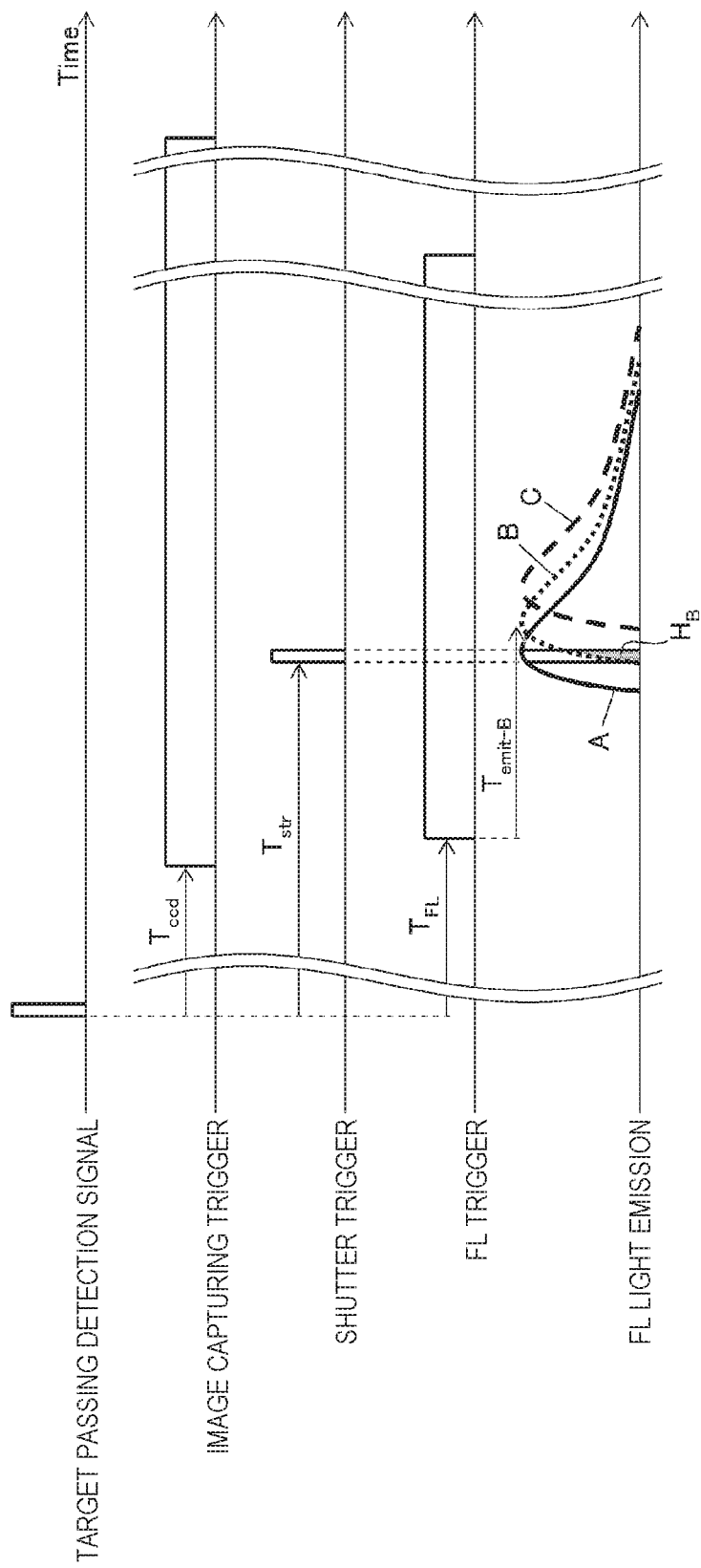
FIG. 8 is a timing chart illustrating an exemplary case in which setting of a delay time $T_{FL}$ of an FL trigger is inappropriate.

FIG. 8 illustrates an exemplary case in which the delay time $T_{FL}$ of the FL trigger is inappropriately set. Among FL light emission waveforms illustrated at the lowest part in FIG. 8, the waveform of a light emission state denoted by Reference Sign A is same as that of the light emission state illustrated in FIG. 5, in which the light emission peak substantially coincides with the timing of the shutter trigger.

The waveforms denoted by Reference Signs B and C correspond to states in which the light emission peak of the flash lamp 92 is shifted from the timing of the shutter trigger due to a longer time lag between the trigger input timing of the FL trigger and light emission from the flash lamp 92.

In FIG. 5, when the time lag between the trigger input timing and the light emission peak reached is referred to as a light emission peak reach time $T_{emit}$, $T_{emit}$ of the FL light emission in FIG. 5 changes to, for example, $T_{emit-B}$ illustrated in FIG. 8 due to degradation or the like of the flash lamp 92.

In this case, for example, in the state denoted by Reference Sign B, the area of a hatched part $H_B$ overlapping with the duration in which the shutter trigger is on is smaller than the area of the hatched part $H_A$ described with reference to FIG. 5, and the background luminance of a captured image decreases. In the state denoted by Reference Sign C, the duration in which the shutter trigger is on is completely shifted from the FL light emission duration, and the background luminance of a captured image extremely decreases.

FIG. 9 is a schematic diagram of images captured by the image sensor 107 when the time lag between the inputting of the FL trigger and the FL light emission is in the states A, B, and C in FIG. 8. Image A illustrated leftmost in FIG. 9 is a schematic diagram of the image captured by the image sensor 107 when the time lag between the inputting of the FL trigger and the FL light emission is in the state denoted by "A" in FIG. 8. Image B illustrated at the center in FIG. 9 is a schematic diagram of the image captured by the image sensor 107 when the time lag between the inputting of the FL trigger and the FL light emission is in the state denoted by "B" in FIG. 8. Image C illustrated rightmost in FIG. 9 is a schematic diagram of the image captured by the image sensor 107 when the time lag between the inputting of the FL trigger and the FL light emission is in the state denoted by "C" in FIG. 8.

When the time lag between the FL trigger inputting and the light emission changes from A to B and then to C in FIG.

8 due to use of the flash lamp 92 for a long duration, the backgrounds of the images captured by the image sensor 107 are gradually darker in the order of Image A, Image B, and Image C in FIG. 9. Each black circle in Image A, Image B, and Image C represents a droplet shadow.

Figure 10:
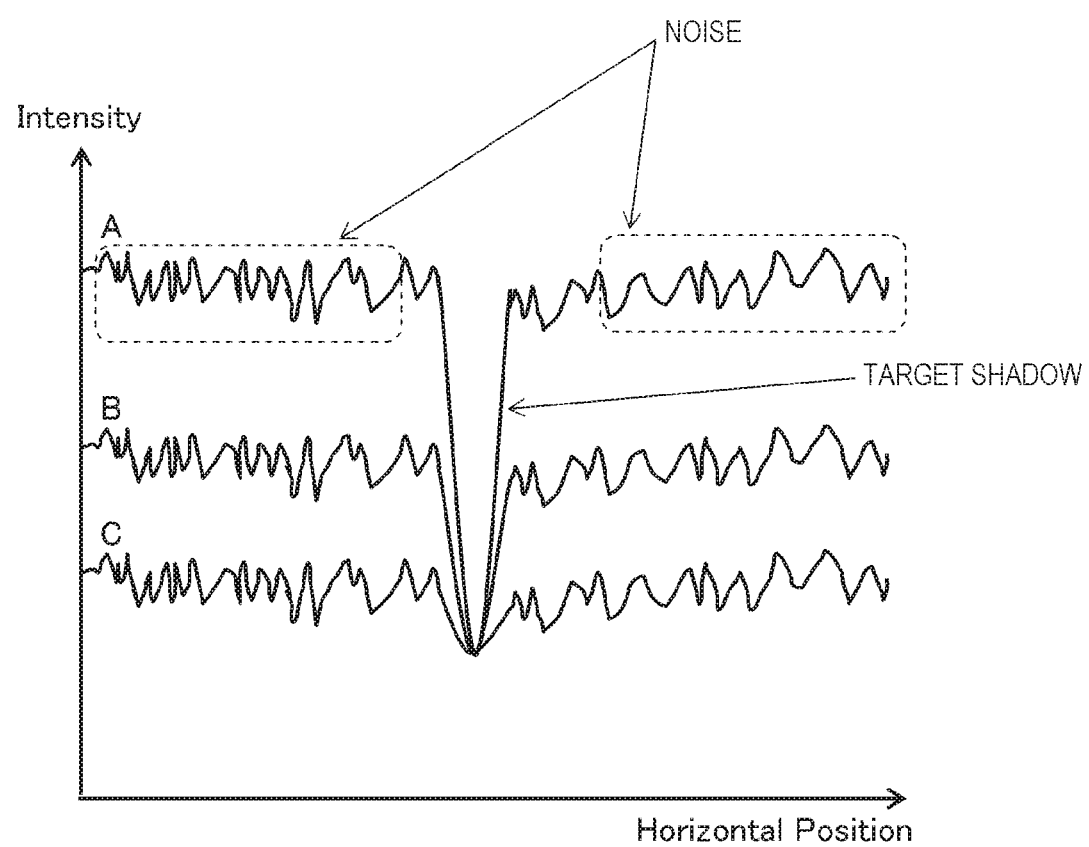
FIG. 10 is a graph illustrating a line profile indicating signal strength in a horizontal direction illustrated with a dashed line in each of Images A to C illustrated in FIG. 9.

FIG. 10 illustrates a line profile indicating the signal strength in a horizontal direction illustrated with a dashed line in each of Images A to C. In FIG. 10, the horizontal axis represents the position in the horizontal direction, and the vertical axis represents the signal strength, in other words, luminance. The signal strength can be represented by a count value of a pixel in image data, which is a digital signal value.

The line profile denoted by "A" in FIG. 10 is a sectional profile along Dashed Line "a" in Image A in FIG. 9. The line profile denoted by "B" in FIG. 10 is a sectional profile along Dashed Line "b" in Image B in FIG. 9. The line profile denoted by "C" in FIG. 10 is a sectional profile along Dashed Line "c" in Image C in FIG. 9. In each line profile illustrated in FIG. 10, the signal strength is lower for a part corresponding to the shadow of the target than a background part. Signal variation at the background part is caused by heat noise. In a case of a captured image such as Image A having a bright background, the grayscale difference between the shadow of the target and the background is large, and thus it is possible to appropriately discriminate a target signal corresponding to the shadow of the target. The target signal is a signal due to image capturing of the shadow of the target.

When the background luminance is low as in Image B, it is difficult to discriminate the target signal from noise. When the background luminance further decreases as in Image C, it is impossible to discriminate the target from background noise. Thus, as the background luminance decreases, the signal level decreases, and the influence of noise on the target signal relatively increases. As a result, error in measurement of the position, shape, and the like of the target based on a captured image increases, and the measurement becomes impossible in the worst case.

When the synchronization with the exposure timing is lost and the integrated light amount over the exposure time decreases due to aging or state change of the flash lamp 92 as described above, contrast between the shadow of the target and the background decreases, and the target measurement accuracy decreases accordingly.

6.2 Second Problem

The second problem is as follows. When the flash lamp is used for a long period, the total light emission amount of the flash lamp decreases due to aging. The phenomenon as described with reference to FIGS. 7 and 8 potentially occurs when the light emission amount of the flash lamp decreases. As a result, similarly to the first problem, error in measurement of the position, shape, and the like of the target based on a captured image increases, and the measurement potentially becomes impossible in the worst case. The first and second problems can occur in a combined manner.

7. First Embodiment 7.1 Configuration

Figure 11:
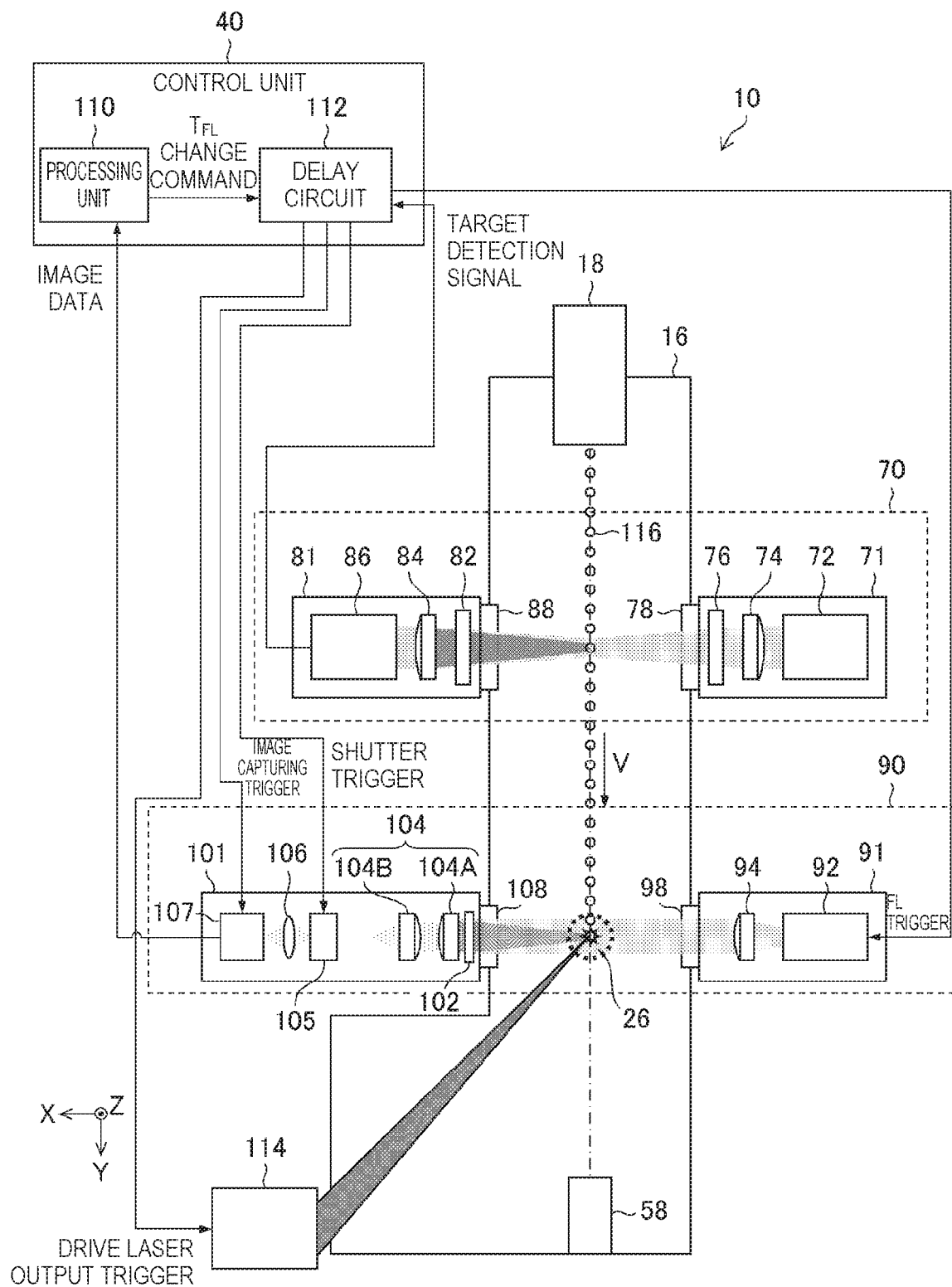
FIG. 11 is a diagram schematically illustrating the configuration of an EUV light generation device including a target image capturing device according to a first embodiment.

FIG. 11 is a diagram schematically illustrating the configuration of an EUV light generation device including a target image capturing device according to a first embodiment. The control unit 40 performs control to adjust the delay time of the delay circuit 112 by using a result of background luminance measurement of a captured image by the processing unit 110.

7.2 Operation

Figure 12:
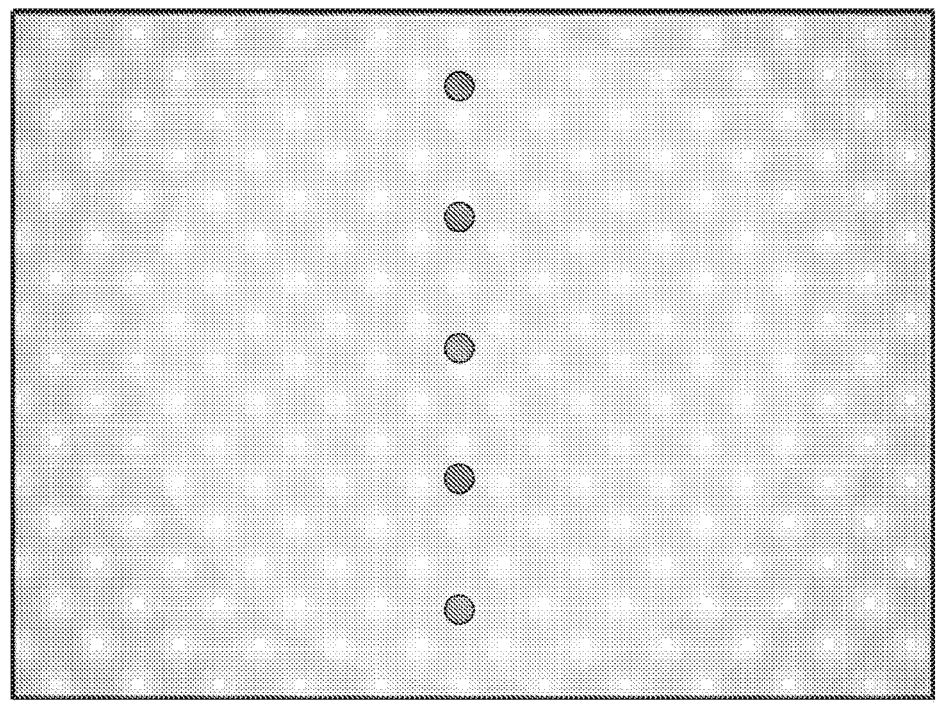
FIG. 12 is a diagram exemplarily illustrating an image of image data of a captured image obtained from the image sensor.

The processing unit 110 measures the background luminance of a captured image based on image data of the captured image obtained from the image sensor 107. FIG. 12 exemplarily illustrates image data of a captured image. The captured image includes a droplet shadow. The background luminance may be measured from such a captured image by, for example, measurement methods "a" to "c" as follows.

Measurement method "a": the background luminance is obtained as an average count value over the entire captured image. The count value means the digital signal value of a pixel. The count value expresses the intensity of light received by the pixel as a numerical value at one of a predetermined number of gradations. The count value is larger for a higher luminance. For example, when the predetermined number of gradations is 256 gradations (8 bits), the count value is expressed as a numerical value in the range of 0 to 255.

Measurement method "b": the background luminance is the maximum count value in the entire captured image.

Measurement method "c": the background luminance is a count value corresponding to a peak in a histogram of the count values of the entire captured image.

Figure 13:
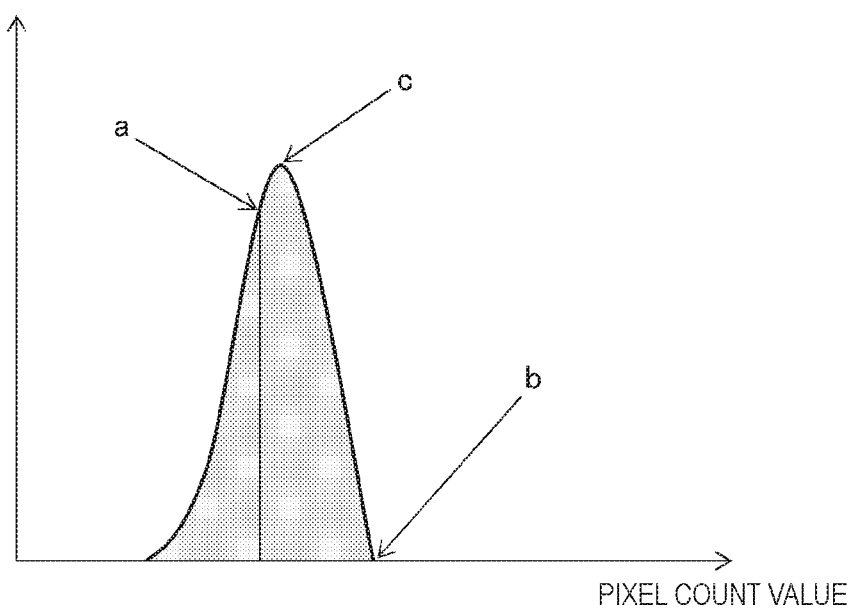
FIG. 13 is a graph illustrating a luminance histogram of the captured image illustrated in FIG. 12.

FIG. 13 illustrates a luminance histogram of the captured image illustrated in FIG. 12. The horizontal axis represents the count value of each pixel of the captured image, and the vertical axis represents the number of pixels. In FIG. 13, Arrow "a" indicates a position on a background luminance histogram acquired by Measurement Method "a". In FIG. 13, Arrow "b" indicates a position on a background luminance histogram acquired by Measurement Method "b". In FIG. 13, Arrow "c" indicates a position on a background luminance histogram acquired by Measurement Method "c".

The background luminance is also measured from the captured image by Measurement Methods "d" and "e" as follows.

Measurement Method "d": the background luminance is the average value of the average count values of a plurality of measurement regions set in advance in the image region of the captured image.

Figure 14:
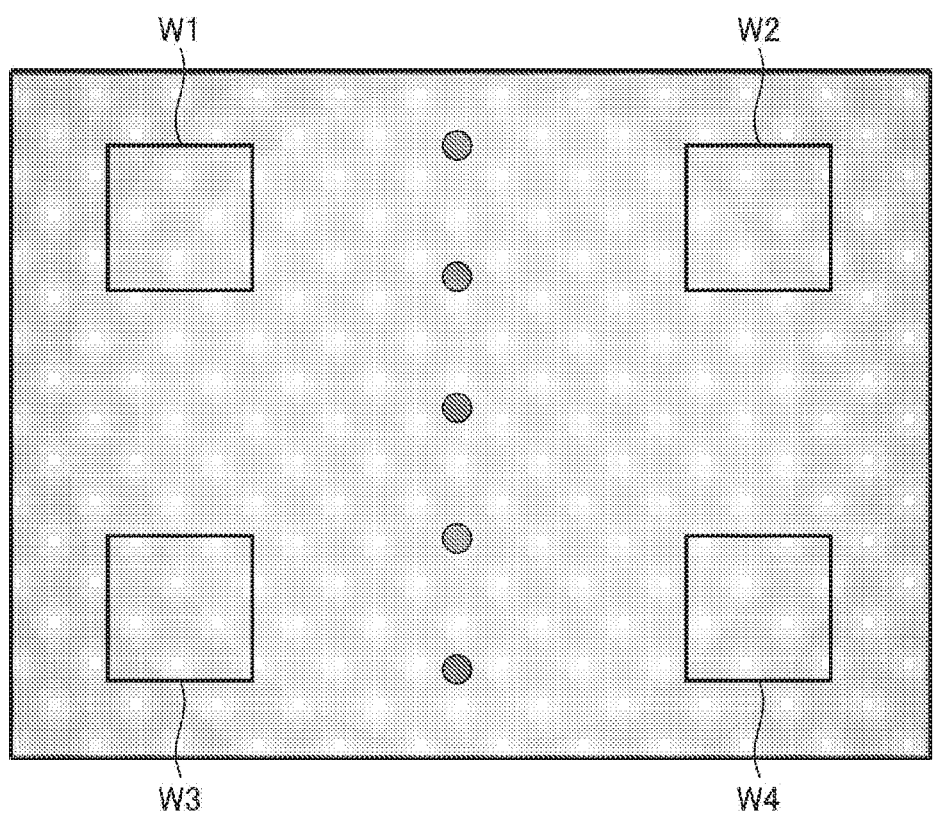
FIG. 14 is a diagram illustrating a plurality of exemplary measurement regions set in an image region of the captured image.

For example, as illustrated in FIG. 14, four measurement regions W1, W2, W3, and W4 are set in advance in the image region of the captured image. FIG. 14 illustrates a rectangular measurement frame that defines the boundary of each of the measurement regions W1, W2, W3, and W4. Each average value (average count value) is calculated only in each measurement frame, and the average value of four average count values for the respective measurement regions W1, W2, W3, and W4 is employed as the background luminance. The measurement regions preferably include at least two measurement regions having different positions in the Y direction and different positions in the X direction.

Measurement Method "e": the background luminance is the average value of the average count values of remaining measurement regions other than a measurement region including the target among a plurality of measurement regions set in advance in the image region of the captured image.

Figure 15:
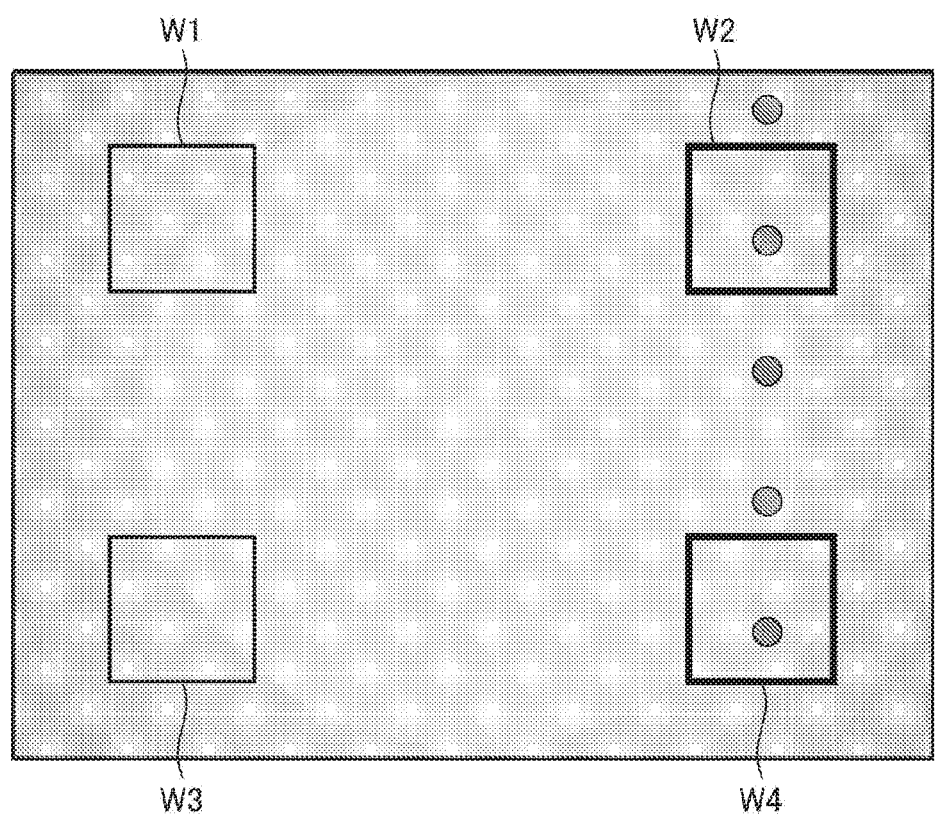
FIG. 15 is a diagram illustrating an exemplary captured image.

FIG. 15 illustrates an exemplary captured image. The captured image illustrated in FIG. 15 is obtained by performing image capturing with orientation in which the target travels downward on the screen. In the example illustrated in FIG. 15, among measurement regions W1 to W4 set in advance, the measurement regions W2 and W4 including the target are excluded from the background luminance calculation. In this case, the average count value is calculated for each of the remaining measurement regions W1 and W3, and the average value of the two average count values for the respective measurement regions W1 and W3 is employed as the background luminance.

The determination of whether the target is included in each measurement region can be performed by, for example, any one of the following two methods or a combination of both methods.

[Target Existence Determination Method 1]

The target existence is determined based on information on a supply position of the target. The control unit 40 holds information on the supply position of the target, which is output from the target supply unit 18. The target supply unit 18 is attached to the chamber 16 through a two-dimensional stage (not illustrated). The control unit 40 controls the supply position of the target by controlling the two-dimensional stage (not illustrated). The control unit 40 holds the supply position of the target as control information for the two-dimensional stage. The control unit 40 can determine the position of the target in a captured image based on information of the target supply position.

[Target Existence Determination Method 2]

The target existence is determined from information of the lowest luminance in each measurement region in a captured image. As described above, the target appears as a shadow in the captured image. The luminance is low at a part corresponding to the shadow, and thus it can be determined that the target is included in the measurement region when the lowest luminance of a pixel in the measurement region is lower than a predetermined value.

Figure 16:
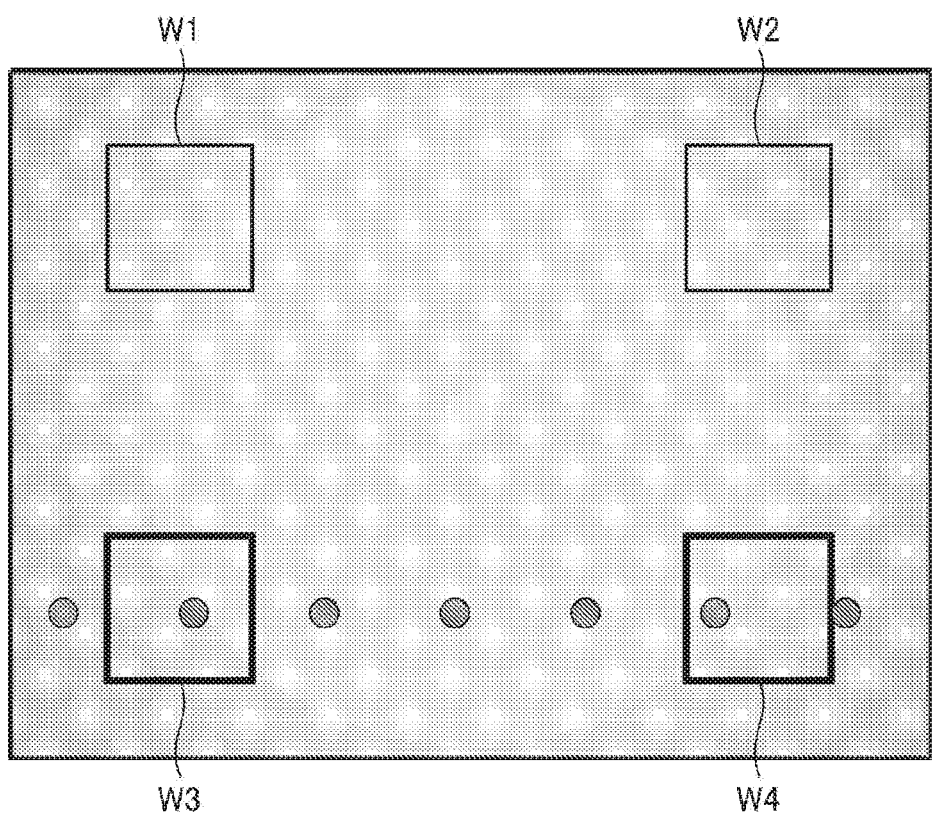
FIG. 16 is a diagram illustrating another exemplary captured image.

FIG. 16 illustrates another exemplary captured image. The captured image illustrated in FIG. 16 is obtained by performing image capturing with orientation in which the target travels rightward on the screen. The captured image as illustrated in FIG. 16 is obtained in some cases, depending on the direction of the image sensor 107. In the case of FIG. 16, among the measurement regions W1, W2, W3, and W4 set in advance in the image regions of the captured image, the measurement regions W3 and W4 including the target are excluded from calculation of the background luminance. In this case, average count values are calculated for the respective measurement regions W1 and W2, and the average value of the two average count values for the respective measurement regions W1 and W2 is employed as the background luminance.

According to Measurement Method "d" or "e", since measurement regions for calculating the background luminance are fixed and limited in advance in a captured image, the background luminance can be acquired faster with a smaller calculation amount than Measurement Methods "a" to "c".

As described for Measurement Method "e", variance of the average luminance depending on the state of the target can be reduced by excluding, as a calculation target, a measurement region including the target.

As exemplarily illustrated in FIGS. 14 to 16, when a plurality of measurement regions are set in advance in the image region of a captured image, it is possible to avoid a case in which measurement cannot be performed when the target is included in any measurement region.

7.3 $T_{FL}$ Adjustment Execution Timing

The background luminance measurement may be constantly performed, for example, at each target measurement or each plurality of times of target measurement. Then, $T_{FL}$ adjustment is performed when the measured background luminance is lower than the allowable variation width (for example, 90%) of a predetermined reference luminance. The $T_{FL}$ adjustment is adjustment of the delay time $T_{FL}$ of the FL trigger to an optimum value.

When the measured background luminance is not lower than 90% of the reference luminance, the $T_{FL}$ adjustment may be periodically performed at each elapse of a defined duration of one week to one month approximately.

7.4 Exemplary $T_{FL}$ Adjustment Processing Algorithm

Figure 17:
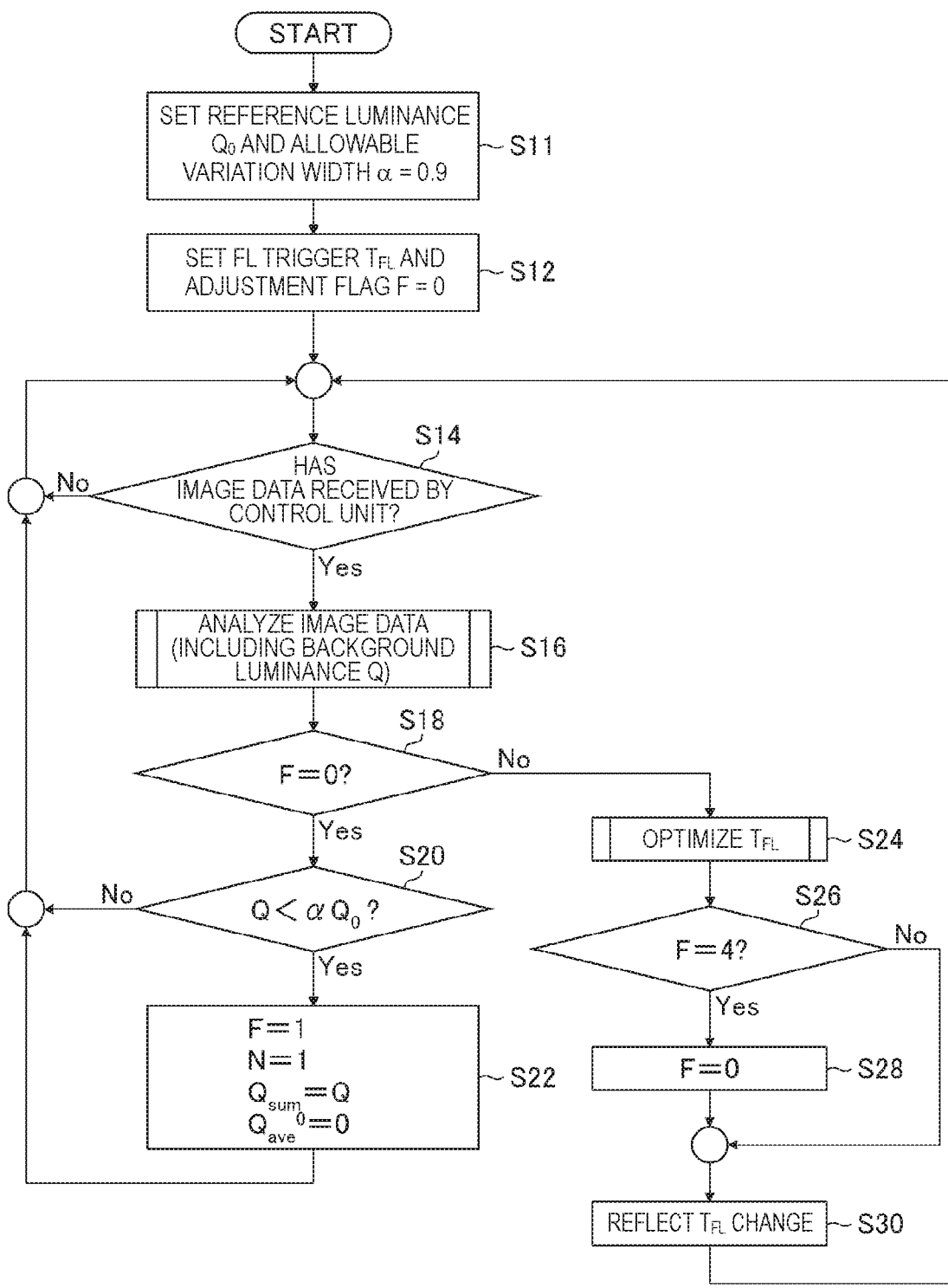
FIG. 17 is a flowchart of $T_{FL}$ adjustment processing in the target image capturing device according to the first embodiment.

FIG. 17 is a flowchart of $T_{FL}$ adjustment processing at the target image capturing device according to the first embodiment. Each step in the flowchart illustrated in FIG. 17 may be performed when a computer program is executed by one or a plurality of central processing units (CPU) that function as the control unit 40.

At step S11, the control unit 40 sets a reference luminance $Q_0$ and an allowable variation width $\alpha$ in advance. The allowable variation width $\alpha$ is set to be, for example, 0.9. The setting of $\alpha=0.9$ means allowance up to 90% of the reference luminance $Q_0$.

At step S12, the control unit 40 sets the flash trigger delay time $T_{FL}$ and sets an adjustment flag F to be "0". It is assumed that the delay time $T_{FL}$ of the FL trigger is adjusted in advance by step S12, and the control unit 40 sets $T_{FL}$ adjusted in advance. The adjustment flag F indicates the state of the $T_{FL}$ adjustment. In the present example, the flag F takes any of the values 0, 1, 2, 3, and 4.

The flag F=0 corresponds to a state in which the adjustment is completed.

The flag F=1 corresponds to a state in which the adjustment is started. In the state of F=1, the background luminance at the current $T_{FL}$ value is acquired.

The flag F=2 corresponds to a first state in the adjustment. In the state of F=2, background luminance data when $T_{FL}$ is decreased is acquired.

The flag F=3 corresponds to a second state in the adjustment. In the state of F=3, background luminance data when $T_{FL}$ is increased is acquired.

The flag F=4 corresponds to a third state in the adjustment. The flag F=4 indicates that $T_{FL}$ optimization processing is completed.

At step S14, the control unit 40 determines whether image data has been received from the image sensor 107. When the determination at step S14 is negative, the control unit 40 waits for image data reception while executing the processing at step S14 in a loop.

At step S14, when having received image data obtained through image capturing by the target image capturing device, the control unit 40 proceeds to step S16.

At step S16, the processing unit 110 performs image data analysis. The processing unit 110 acquires a background luminance Q of the captured image in the image data analysis. The background luminance Q can be acquired by any of Measurement Methods "a" to "e" described above or an appropriate combination of these methods. The processing content of the image data analysis (step S16) will be described later in detail.

At step S18, the control unit 40 determines whether the adjustment flag F is "0". When having determined that the flag F is "0" through the determination at step S18, the control unit 40 proceeds to step S20. At step S20, the control unit 40 determines whether the background luminance Q is lower than the allowable variation width $\alpha$ for the reference luminance $Q_0$. In other words, the control unit 40 determines whether $Q<\alpha Q_0$ is satisfied. The product of the reference luminance $Q_0$ and the allowable variation width $\alpha$ corresponds to an exemplary allowable lower limit luminance. The allowable lower limit luminance does not need to be set based on the product of the reference luminance $Q_0$ and the allowable variation width α. The allowable lower limit luminance may be a predetermined value.

At step S20, when $Q \geq \alpha Q_0$ holds, the control unit 40 returns to step S14 and waits for reception of next image data.

At step S20, when the background luminance Q is lower than the product of the reference luminance $Q_0$ and the allowable variation width α, the control unit 40 proceeds to step S22.

At step S22, the control unit 40 sets the adjustment flag F to be "1", and sets a variable N indicating the number of times of image capturing to be one. In addition, the control unit 40 sets a cumulated value $Q_{sum}$ of the background luminance to be Q and sets an average value $Q_{ave}^0$ of the background luminance to be zero, and then returns to step S14.

Thereafter, when the processing unit 110 receives image data and the control unit 40 proceeds to step S18 through step S16, the determination at step S18 is negative since the flag F is set to be "1", and the control unit 40 proceeds to step S24.

At step S24, the control unit 40 executes subroutines of the $T_{FL}$ optimization processing. The content of the $T_{FL}$ optimization processing will be described later in detail with reference to FIG. 25. The $T_{FL}$ optimization processing involves background luminance calculation processing and delay time correction based on a result of this calculation. In the process of the $T_{FL}$ optimization processing, the adjustment flag F is changed to any of "1", "2", "3", and "4".

At step S26, the control unit 40 determines whether F=4 holds. When having determined that F=4 does not hold at step S26, the control unit 40 proceeds to step S30 to reflect change of $T_{FL}$ to the device, and then returns to step S14.

When the $T_{FL}$ optimization processing is completed and an optimum $T_{FL}$ value is determined, the adjustment flag F is "4". When having determined that F=4 holds at step S26, the control unit 40 proceeds to step S28. The control unit 40 sets the adjustment flag F to be "0" at step S28, and then proceeds to step S30 to reflect the optimized $T_{FL}$ before returning to step S14.

Figure 18:
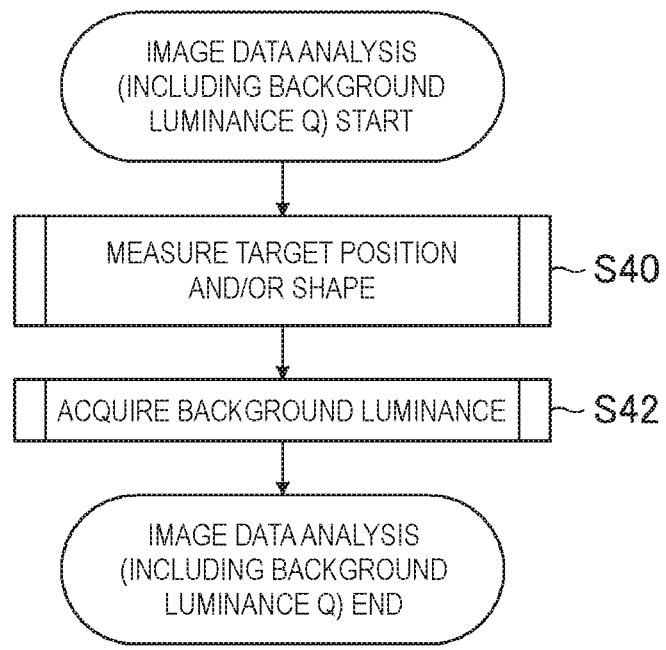
FIG. 18 is a flowchart of image data analysis processing.

FIG. 18 is a flowchart of image data analysis processing. The image data analysis processing includes a target position and/or shape measurement subroutine (step S40) and a background luminance acquisition subroutine (step S42).

At step S40, the control unit 40 performs target position and/or shape measurement. For example, the processing unit 110 of the control unit 40 measures, from the captured image, at least one of a droplet diameter, a droplet position, a droplet interval, and the spread shape of mist (diffused target).

At step S42, the control unit 40 employs processing corresponding to any one of the five measurement methods "a" to "e" as the background luminance acquisition subroutine, and measures the background luminance. Background luminance acquisition processing based on Measurement Method "a" is referred to as "Background Luminance Acquisition "a"". Background luminance acquisition processing based on Measurement Method "b" is referred to as "Background Luminance Acquisition "b"". Background luminance acquisition processing based on Measurement Method "c" is referred to as "Background Luminance Acquisition "c"". Background luminance acquisition processing based on Measurement Method "d" is referred to as "Background Luminance Acquisition "d"". Background luminance acquisition processing based on Measurement Method "e" is referred to as "Background Luminance Acquisition "e"".

Figure 19:
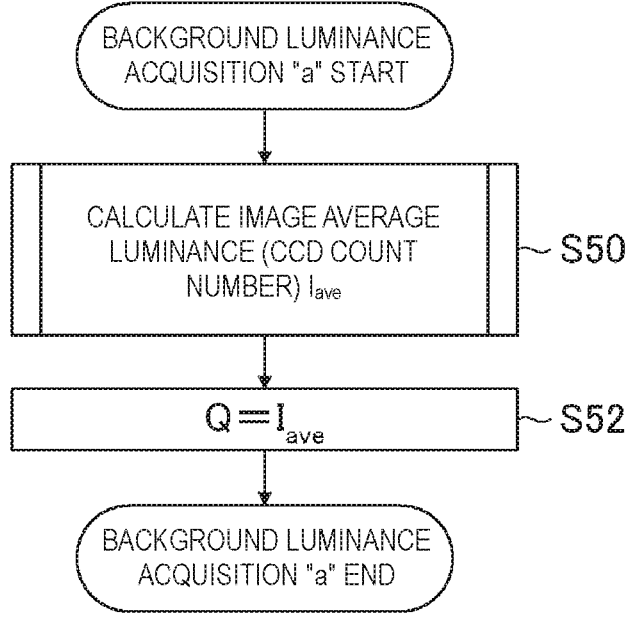
FIG. 19 is a flowchart illustrating the processing content of Background Luminance Acquisition "a".

FIG. 19 is a flowchart illustrating the processing content of Background Luminance Acquisition "a". At step S50, the processing unit 110 calculates an average luminance $I_{ave}$ of the image. The average luminance is obtained by calculating the average value of the count numbers of pixels of digital image data obtained from the CCD image sensor as the image sensor 107, in other words, the average value of pixel values in the entire captured image.

At step S52, the control unit 40 employs $I_{ave}$ as the background luminance Q.

Figure 20:
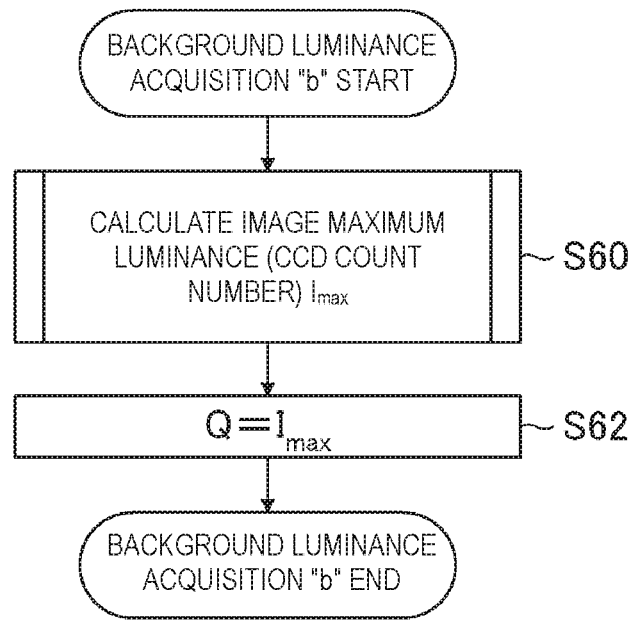
FIG. 20 is a flowchart illustrating the processing content of Background Luminance Acquisition "b".

FIG. 20 is a flowchart illustrating the processing content of Background Luminance Acquisition "b". At step S60, the processing unit 110 calculates a maximum luminance $I_{max}$ of the image. The maximum luminance is obtained by specifying a largest count number from among the count numbers of pixels of digital image data obtained from the CCD image sensor as the image sensor 107.

At step S62, the control unit 40 employs $I_{max}$ as the background luminance Q.

Figure 21:
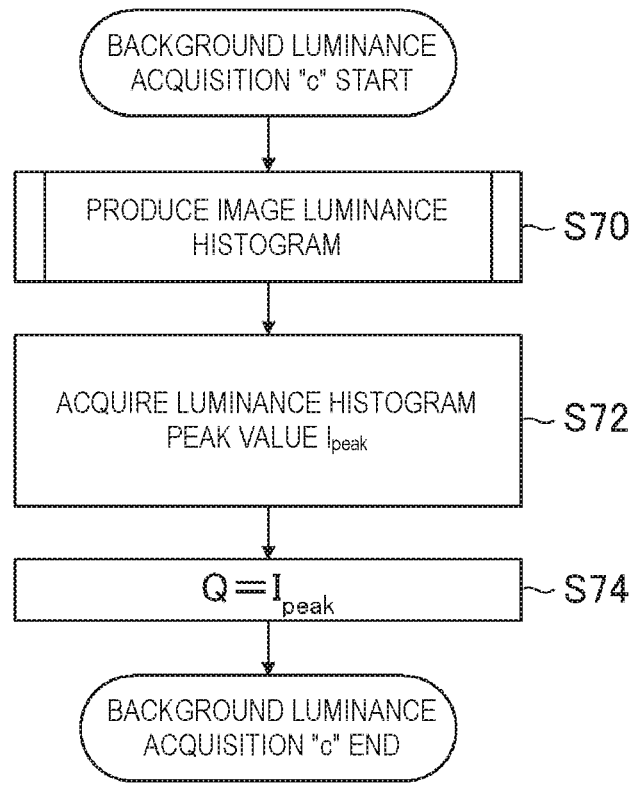
FIG. 21 is a flowchart illustrating the processing content of Background Luminance Acquisition "c".

FIG. 21 is a flowchart illustrating the processing content of Background Luminance Acquisition "c".

At step S70, the processing unit 110 produces a luminance histogram of the image. The processing unit 110 produces a luminance histogram as described with reference to FIG. 13 based on the count values of pixels of the captured image.

Thereafter, at step S72, the processing unit 110 acquires a peak value $I_{peak}$ of the luminance histogram. The peak value of the luminance histogram is a count value at which the number of corresponding pixels is at maximum, and means a count value corresponding to a peak.

At step S74, the control unit 40 employs $I_{peak}$ as the background luminance Q.

Figure 22:
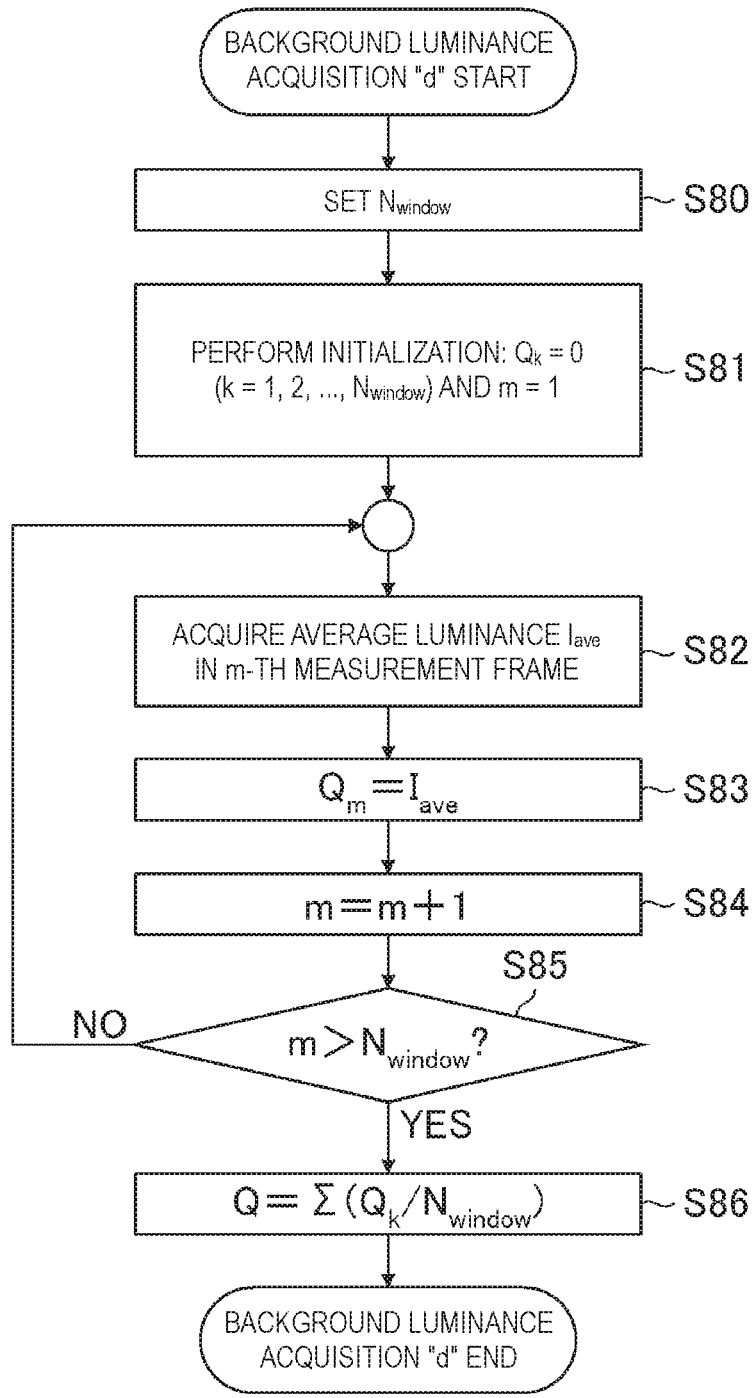
FIG. 22 is a flowchart illustrating the processing content of Background Luminance Acquisition "d".

FIG. 22 is a flowchart illustrating the processing content of Background Luminance Acquisition "d". At step S80, the control unit 40 sets a number $N_{window}$ of measurement regions. In the example described with reference to FIG. 14, $N_{window}$ is four.

At step S81, the control unit 40 initializes a background luminance $Q_k$ for each measurement region, and initializes an index m for specifying a measurement region as a calculation target. The initializing processing at step S81 sets $Q_k=0$ (k=1, 2, . . . , $N_{window}$) and m=1. The index k identifies each of the $N_{window}$ measurement regions.

At step S82, the processing unit 110 acquires the average luminance $I_{ave}$ in the m-th measurement frame. The m-th measurement frame is synonymous with the m-th measurement region.

At step S83, the control unit 40 sets $Q_m=I_{ave}$, and proceeds to step S84.

At step S84, the control unit 40 increments the index m to newly set m+1 to the value of m.

Then, at step S85, the control unit 40 determines whether m exceeds $N_{window}$. When m is equal to or smaller than $N_{window}$ at step S85, the control unit 40 returns to step S82 and repeats the processing at steps S82 to S85.

When m exceeds $N_{window}$ at step S85, the control unit 40 proceeds to step S86.

At step S86, the processing unit 110 calculates the average value of $N_{window}$ values of $Q_k$ (k=1, 2, . . . , $N_{window}$), and employs the calculated average value as the background luminance Q of the captured image.

Figure 23:
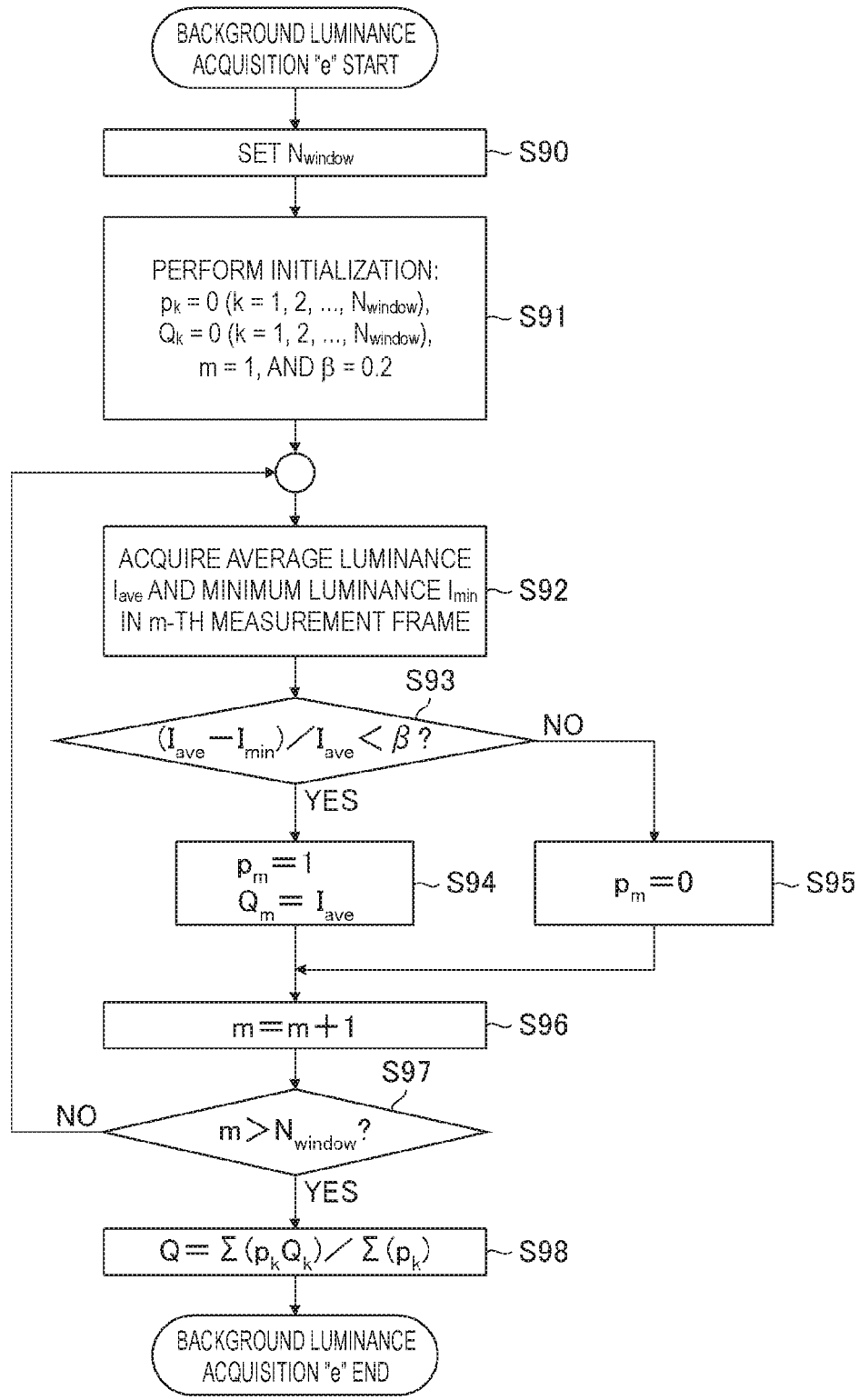
FIG. 23 is a flowchart illustrating the processing content of Background Luminance Acquisition "e".

FIG. 23 is a flowchart illustrating the processing content of Background Luminance Acquisition "e". At step S90, the control unit 40 sets the number $N_{window}$ of measurement regions. In the example described with reference to FIGS. 15 and 16, $N_{window}$ is four.

At step S91, the control unit 40 performs various kinds of initializing processing necessary for calculation. The control unit 40 initializes a parameter $p_k$ that determines the validity of measurement data for each measurement region: $p_k=0$ (k=1, 2, ..., $N_{window}$). The control unit 40 initializes the background luminance $Q_k$ for each measurement region: $Q_k=0$ (k=1, 2, ..., $N_{window}$). The control unit 40 sets the index m for specifying a measurement region as a calculation target to be one: m=1. The control unit 40 also sets a value β as a reference of determination of whether the target exists in a measurement frame to be, for example, 0.2: β=0.2.

At step S92, the control unit 40 acquires the average luminance $I_{ave}$ and a minimum luminance $I_{min}$ in the m-th measurement frame. The processing unit 110 performs processing of calculating the average luminance $I_{ave}$ and the minimum luminance $I_{min}$ in the m-th measurement frame. At step S93, the control unit 40 determines whether $(I_{ave}-I_{min})/I_{ave}$ is smaller than β.

When the target is included in the measurement frame, the value $(I_{ave}-I_{min})/I_{ave}$ is close to one. When the target is not included in the measurement frame, the value $(I_{ave}-I_{min})/I_{ave}$ is close to zero.

When having determined that $(I_{ave}-I_{min})/I_{ave}$ is smaller than β at step S93, the control unit 40 proceeds to step S94. At step S94, the control unit 40 sets $p_m=1$ and $Q_m=I_{ave}$ and then proceeds to step S96.

When having determined that $(I_{ave}-I_{min})/I_{ave}$ is equal to or larger than β at step S93, the control unit 40 proceeds to step S95. At step S95, the control unit 40 sets $p_m=0$ and then proceeds to step S96.

At step S96, the control unit 40 increments the index m to newly set m+1 to the value of m.

At step S97, the control unit 40 determines whether m exceeds $N_{window}$. When m is equal to or smaller than $N_{window}$ at step S97, the control unit 40 returns to step S92 and repeats the processing at steps S92 to S97.

When having determined that m exceeds $N_{window}$ at step S97, the control unit 40 proceeds to step S98.

At step S98, the processing unit 110 calculates the background luminance Q of the captured image in accordance with the formula of $Q=\Sigma(p_k Q_k)/\Sigma(p_k)$. The symbol Σ indicates a sum over k=1 to $N_{window}$. Accordingly, measurement data of a measurement frame with $p_m=0$ is excluded, and only measurement data of a measurement frame with $p_m=1$ is used to calculate the background luminance Q.

A table in FIG. 24 lists advantages and disadvantages of Background Luminance Acquisition "a" to "e" described with reference to FIGS. 19 to 23. In the table, "A" indicates relatively high evaluation, and "B" indicates evaluation less than "A".

As for processing complication, Background Luminance Acquisition "a" and Background Luminance Acquisition "b" are serial processing and thus easy to process. However, Background Luminance Acquisition "c", "d", and "e" are rather complicated to process.

As for the processing range, Background Luminance Acquisition "a", "b", and "c" have processing ranges over the entire image, and thus need time to process. However, Background Luminance Acquisition "d" and "e" have processing ranges limited to ranges defined by region frames, and thus can be processed in a short time.

As for influence of a target image, the background luminance is hardly affected by the target image in principle in Background Luminance Acquisition "b", "c", and "e". However, in Background Luminance Acquisition "a" and "d", the background luminance is affected by the target image.

The influence of heat noise appears only in a measurement result by Background Luminance Acquisition "b".

When comprehensively evaluated from FIG. 24, Background Luminance Acquisition "e" is a most preferable method among Background Luminance Acquisition "a" to "e".

Figure 25:
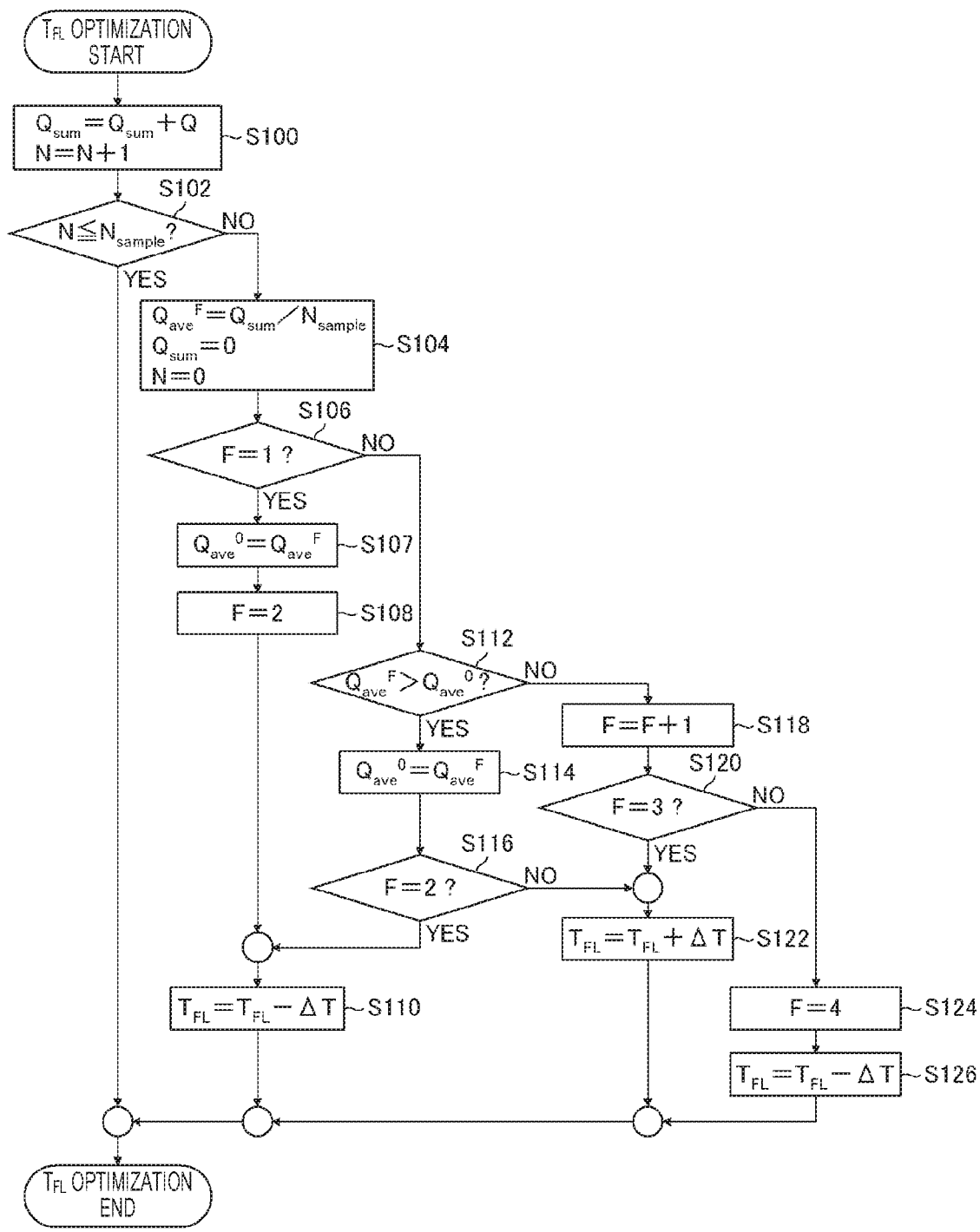
FIG. 25 is a flowchart illustrating the processing content of $T_{FL}$ optimization.

FIG. 25 is a flowchart illustrating the processing content of $T_{FL}$ optimization. Overview of processing illustrated in FIG. 25 is described before detailed description of each step. The control unit 40 performs $N_{sample}$ times of image capturing with the current $T_{FL}$, calculates the average value of the background luminance for image data of a captured image obtained through each image capturing, and stores the average value as $Q_{ave}{}^0=Q_{ave}{}^1$ (step S107).

Thereafter, the control unit 40 sets F=2 (step S108), and subtracts ΔT from $T_{FL}$ (step S110). The value ΔT is a predetermined adjustment amount step width determined to be, for example, 50 nanoseconds [ns]. The control unit 40 reflects the newly set $T_{FL}$ to the device (step S30 in FIG. 17), and performs $N_{sample}$ times of image capturing again (steps S100 to S102 in FIG. 25). The control unit 40 calculates the average value of the background luminance for image data of a captured image obtained through each of the $N_{sample}$ times of image capturing, and sets the average value to $Q_{ave}{}^2$ (step S104).

When $Q_{ave}{}^2>Q_{ave}{}^0$ holds, the control unit 40 sets $Q_{ave}{}^0=Q_{ave}{}^2$ (step S114), and subtracts ΔT from $T_{FL}$ again (step S110). Then, the control unit 40 reflects the newly set $T_{FL}$ to the device (step S30 in FIG. 17), and performs $N_{sample}$ times of image capturing again (steps S100 to S102 in FIG. 25). The control unit 40 calculates the average value of the background luminance for image data of a captured image obtained through each of the $N_{sample}$ times of image capturing, and sets the average value to $Q_{ave}{}^2$ (step S114).

When $Q_{ave}{}^2 \leq Q_{ave}{}^0$ holds at step S112, the control unit 40 sets the adjustment flag F to be "3" (step S118), and adds ΔT to $T_{FL}$ (step S122).

The control unit 40 reflects the newly set $T_{FL}$ to the device (step S30 in FIG. 17), and performs $N_{sample}$ times of image capturing again. The control unit 40 calculates the average value of the background luminance for image data of a captured image obtained through each of the $N_{sample}$ times of image capturing, and sets the average value to $Q_{ave}{}^3$ (step S104).

When $Q_{ave}{}^3>Q_{ave}{}^0$ holds at step S112, the control unit 40 sets $Q_{ave}{}^0=Q_{ave}{}^3$ (step S114), and adds ΔT to $T_{FL}$ again (step S122). Then, the control unit 40 reflects the newly set $T_{FL}$ to the device (step S30 in FIG. 17), and performs $N_{sample}$ times of image capturing again (steps S100 to S102 in FIG. 25). The control unit 40 calculates the average value of the background luminance for image data of a captured image obtained through each of the $N_{sample}$ times of image capturing, and sets the average value to $Q_{ave}{}^3$ (step S114).

When $Q_{ave}{}^3 \leq Q_{ave}{}^0$ holds at step S112, the control unit 40 sets the adjustment flag F to be "4" (steps S118 and S124), and subtracts ΔT from $T_{FL}$ (step S126). Thereafter, the control unit 40 returns to the main flow illustrated in FIG. 17, and then reflects the newly set $T_{FL}$ to the device (step S30) and sets the adjustment flag F to be "0" (step S28), which completes the adjustment.

Each step of the flowchart illustrated in FIG. 25 is described in detail. At step S100, the control unit 40 adds the background luminance Q to the current cumulated value $Q_{sum}$ to obtain a new cumulated value $Q_{sum}$. The control unit 40 increments the number N of times of measurement to set N+1 as new N.

At step S102, the control unit 40 determines whether N is equal to or smaller than $N_{sample}$. When the determination at step S102 is positive, the control unit 40 proceeds to step S24 in FIG. 17.

When N exceeds $N_{sample}$ at step S102 in FIG. 25, the control unit 40 proceeds to step S104. At step S104, the control unit 40 calculates an average value $Q_{ave}^F$ of the background luminance by dividing the cumulated value $Q_{sum}$ by $N_{sample}$. The control unit 40 resets $Q_{sum}$ and N to set $Q_{sum}=0$ and N=0.

At step S106, the control unit 40 determines whether the adjustment flag F is "1". When having determined that the flag F is "1" at step S106, the control unit 40 proceeds to step S107.

At step S107, the control unit 40 sets $Q_{ave}^0=Q_{ave}^F$. At step S108, the control unit 40 sets the adjustment flag F=2.

Then, at step S110, the control unit 40 sets new $T_{FL}$ to be a value obtained by subtracting ΔT from $T_{FL}$. Step S110 corresponds to adjustment in a direction (negative direction) in which the delay time is shortened. The value $T_{FL}$ changed at step S110 is reflected to the device at step S30 in FIG. 17.

When step S106 in FIG. 25 is reached with the adjustment flag F=2, the determination at step S106 is negative, and the control unit 40 proceeds to step S112.

At step S112, the control unit 40 determines whether $Q_{ave}^F$ is larger than $Q_{ave}^0$. When $Q_{ave}^F>Q_{ave}^0$ holds, the control unit 40 proceeds to step S114, and updates $Q_{ave}^0$ to $Q_{ave}^F$. For example, when $Q_{ave}^2$ for F=2 satisfies $Q_{ave}^2<Q_{ave}^0$, $Q_{ave}^0=Q_{ave}^2$ is set at step S114.

At step S116, the control unit 40 determines whether F=2 holds. When having determined that F=2 holds at step S116, the control unit 40 proceeds to step S110 and repeats the same processing.

When the adjustment by ΔT in the negative direction is performed on $T_{FL}$, $Q_{ave}^2 \leq Q_{ave}^0$ eventually holds at step S112. When having determined that $Q_{ave}^2 \leq Q_{ave}^0$ holds at step S112, the control unit 40 proceeds to step S118 and adds one to the value of the adjustment flag F.

Then, at step S120, the control unit 40 determines whether F=3 holds. When having determined that F=3 holds at step S120, the control unit 40 proceeds to step S122 and sets new $T_{FL}$ by adding ΔT to $T_{FL}$. The value $T_{FL}$ thus changed at step S122 is reflected to the device at step S30 in FIG. 17.

When step S112 in FIG. 25 is reached with the adjustment flag F=3 and $Q_{ave}^3>Q_{ave}^0$ holds, the control unit 40 proceeds to step S114 and sets $Q_{ave}^0$ to be $Q_{ave}^3$. When F=3 holds, the determination at step S116 is negative, and the control unit 40 proceeds to step S122 and sets new $T_{FL}$ to be a value obtained by subtracting ΔT from $T_{FL}$ again. Step S122 corresponds to adjustment in a direction (positive direction) in which the delay time is lengthened.

The value $T_{FL}$ changed at step S122 is reflected to the device at step S30 in FIG. 17. When the adjustment by ΔT in the positive direction is performed on $T_{FL}$, $Q_{ave}^3 \leq Q_{ave}^0$ eventually holds at step S112. When having determined that $Q_{ave}^3 \leq Q_{ave}^0$ holds at step S112, the control unit 40 proceeds to step S118 and adds one to the value of the adjustment flag F. When step S118 is reached with F=3, the determination at step S120 is negative. In this case, at step S124, the control unit 40 sets F=4 and proceeds to step S126. At step S126, the control unit 40 sets new $T_{FL}$ by subtracting ΔT from $T_{FL}$. The value $T_{FL}$ determined at step S126 is set to be an optimum $T_{FL}$ value. When step S26 in FIG. 17 is reached after step S126, the determination at step S26 is positive, and the control unit 40 proceeds to step S28. At step S28, the control unit 40 sets the adjustment flag F=0, and completes the $T_{FL}$ adjustment. The value $T_{FL}$ determined at step S126 is reflected to the device at step S30. In this manner, $T_{FL}$ is adjusted so that the background luminance is highest.

The measurement unit 101 described in the first embodiment corresponds to an exemplary "image capturing unit". The combination of the target image measurement device 90 and the control unit 40 corresponds to an exemplary "target image capturing device". The target passing detection signal corresponds to an exemplary timing signal received from outside. The FL trigger corresponds to an exemplary "first trigger signal", and $T_{FL}$ corresponds to an exemplary "first delay time". The image capturing trigger corresponds to an exemplary "second trigger signal", and $T_{ccd}$ corresponds to an exemplary "second delay time". The shutter trigger corresponds to an exemplary "third trigger signal", and $T_{str}$ corresponds to an exemplary "third delay time".

7.5 Effects

A captured image at an appropriate brightness can be obtained by measuring the background luminance from an image obtained by capturing a shadow of the target and adjusting the delay time of the FL trigger. Accordingly, it is possible to prevent decrease of the background luminance due to lost synchronization between the flash lamp light emission timing and the shutter trigger, and maintain the background luminance substantially constant. According to the first embodiment, it is possible to reduce decrease of the background luminance due to aging or state change of the flash lamp 92, thereby maintaining the target measurement accuracy.

8. Second Embodiment 8.1 Configuration

Figure 26:
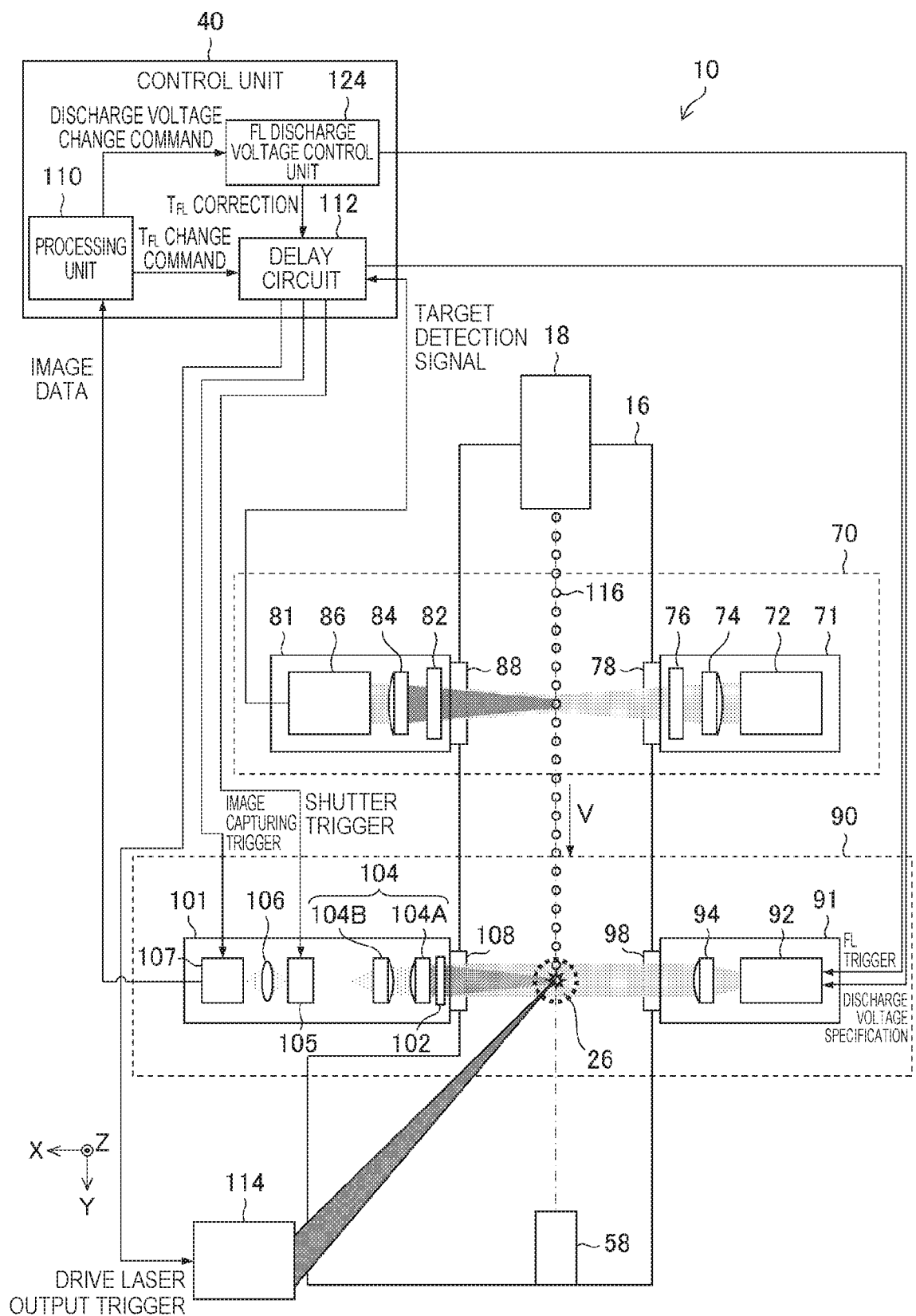
FIG. 26 is a configuration diagram exemplarily illustrating the configuration of an EUV light generation device including a target image capturing device according to a second embodiment.

FIG. 26 is a configuration diagram exemplarily illustrating the configuration of an EUV light generation device including a target image capturing device according to a second embodiment. The following describes difference of the second embodiment illustrated in FIG. 26 from the first embodiment described with reference to FIG. 11.

In the second embodiment illustrated in FIG. 26, the control unit 40 includes an FL discharge voltage control unit 124 in addition to the processing unit 110 and the delay circuit 112. The FL discharge voltage control unit 124 specifies a discharge voltage to the flash lamp 92. The discharge voltage specification by the FL discharge voltage control unit 124 is performed through an analog voltage or communication.

8.2 Operation

When the amount of light discharged at FL light emission has decreased based on a result of processing by the processing unit 110, the FL discharge voltage control unit 124 performs control to adjust the background luminance to the reference luminance by increasing the discharge voltage of the flash lamp 92.

Figure 27:
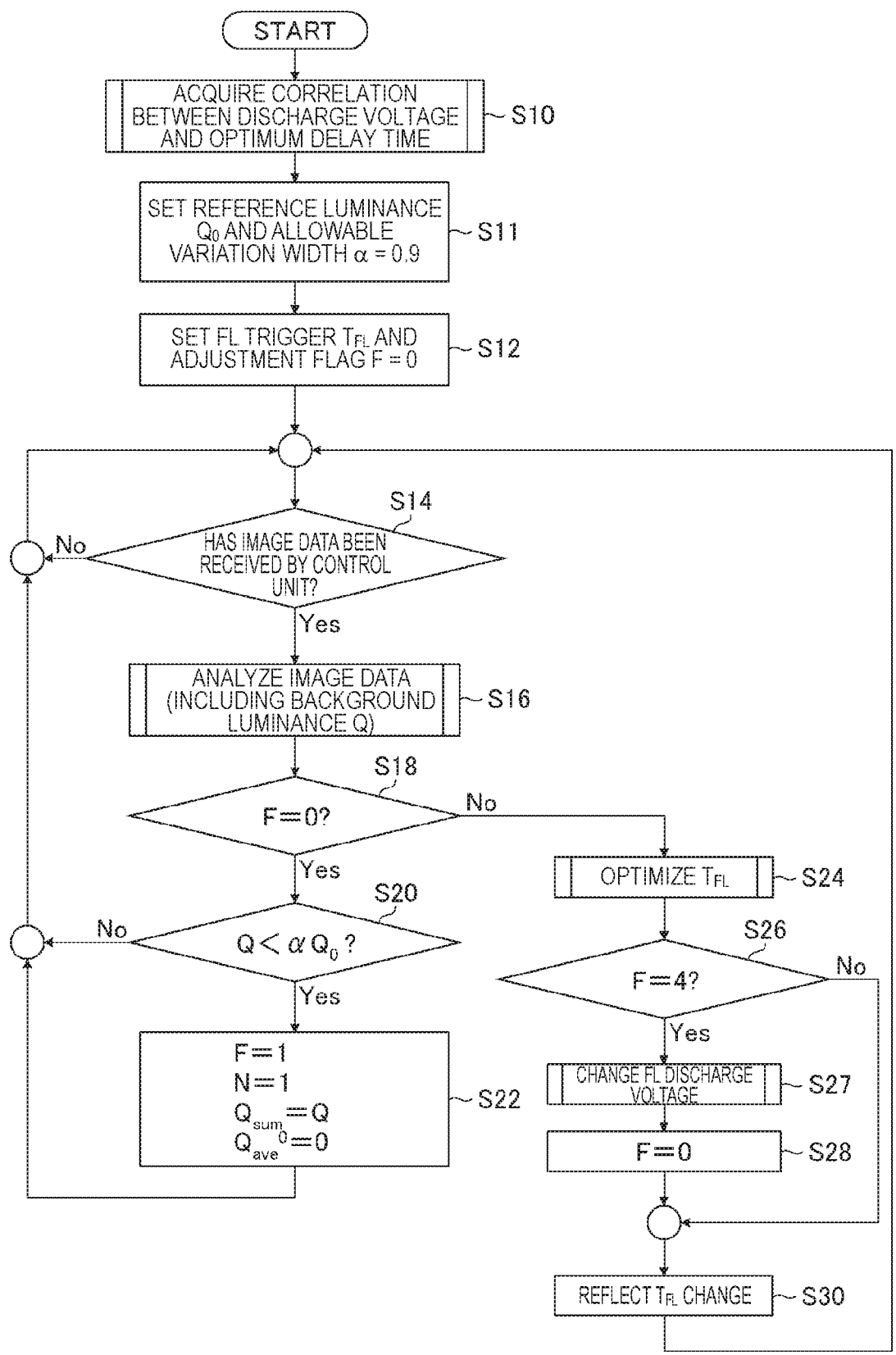
FIG. 27 is a flowchart of the $T_{FL}$ adjustment processing including processing of FL discharge voltage change in the second embodiment.

FIG. 27 is a flowchart of the $T_{FL}$ adjustment processing including FL discharge voltage change processing in the second embodiment. In FIG. 27, a step common to the flowchart described with reference to FIG. 17 is denoted by an identical step number, and description thereof will be omitted.

The flowchart illustrated in FIG. 27 additionally includes "discharge voltage and optimum delay time correlation acquisition" processing (step S10) before step S11, and "FL discharge voltage change" processing (step S27) between steps S26 and S28.

In the second embodiment, when the $T_{FL}$ optimization processing is completed through the processing at step S24 and F=4 holds (when the determination at step S26 is positive), the FL discharge voltage change processing (step S27) is performed.

Figure 28:
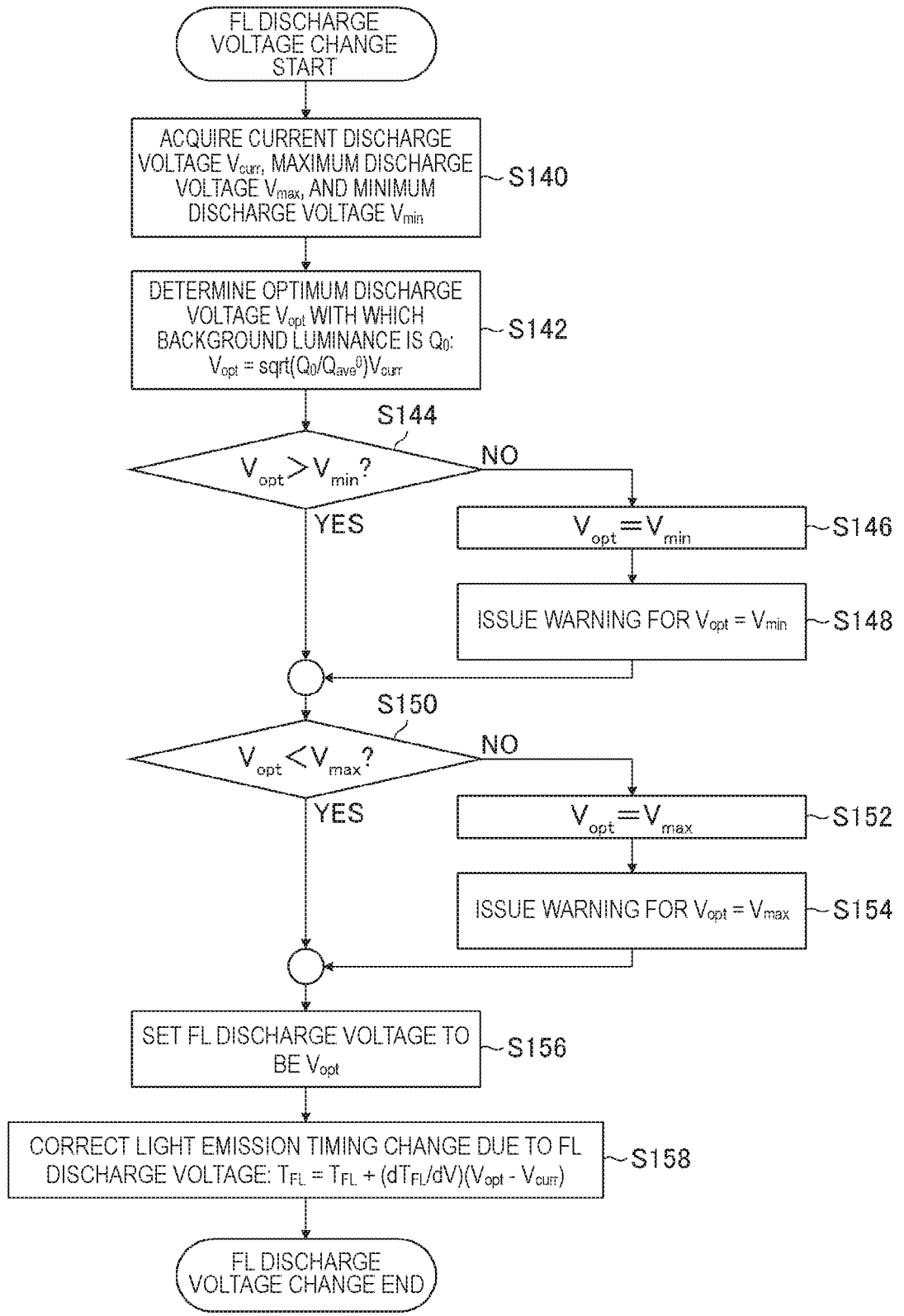
FIG. 28 is a flowchart illustrating the processing content of the FL discharge voltage change.

FIG. 28 is a flowchart illustrating the processing content of the FL discharge voltage change. Overview of the FL discharge voltage change processing illustrated in FIG. 28 is described before detailed description of each step. The flash lamp 92 emits light by electrically discharging voltage stored in a capacitor. The FL discharge voltage control unit 124 calculates an optimum discharge voltage $V_{opt}$ from a current discharge voltage $V_{curr}$ by using the proportionality of the light emission amount of the flash lamp 92 to the square of a charged voltage (step S142). When the calculated $V_{opt}$ exceeds the range of a minimum discharge voltage $V_{min}$ to a maximum discharge voltage $V_{max}$ as an expected use voltage range, the discharge voltage is limited to $V_{min}$ or $V_{max}$ (steps S146 or S152), and a warning is issued (steps S148 or S154).

When the discharge voltage is changed, the time between the FL trigger and the light emission start timing is changed, and thus the set value of the optimum delay time $T_{FL}$ is corrected (step S158).

Each step of the flowchart illustrated in FIG. 28 is described in detail. At step S140, the FL discharge voltage control unit 124 acquires the current discharge voltage $V_{curr}$. The FL discharge voltage control unit 124 also acquires the maximum discharge voltage $V_{max}$ and the minimum discharge voltage $V_{min}$ that are usable.

Then, at step S142, the FL discharge voltage control unit 124 determines the optimum discharge voltage $V_{opt}$ with which the background luminance is equal to the reference luminance $Q_0$. The FL discharge voltage control unit 124 determines $V_{opt}$ based on $V_{opt}=\mathrm{sqrt}(Q_0/Q_{ave}^0)V_{curr}$. The notation $\mathrm{sqrt}(Q_0/Q_{ave}^0)$ means the square root of $Q_0/Q_{ave}^0$.

At step S144, the FL discharge voltage control unit 124 determines whether $V_{opt}$ is higher than $V_{min}$. When $V_{opt} \leq V_{min}$ holds, the FL discharge voltage control unit 124 proceeds to step S146. At step S146, the FL discharge voltage control unit 124 sets $V_{opt}$ to be $V_{min}$. At step S148, the FL discharge voltage control unit 124 issues a warning to notify that the discharge voltage is limited to $V_{min}$. The warning may be issued by, for example, performing warning display on a display (not illustrated) or the like connected with the control unit 40.

At step S144, when having determined that $V_{opt}>V_{min}$ holds or after step S148, the FL discharge voltage control unit 124 proceeds to step S150.

At step S150, the FL discharge voltage control unit 124 determines whether $V_{opt}$ is lower than $V_{max}$. When $V_{opt} \geq V_{max}$ holds, the FL discharge voltage control unit 124 proceeds to step S152. At step S152, the FL discharge voltage control unit 124 sets $V_{opt}$ to be $V_{max}$. At step S154, the FL discharge voltage control unit 124 issues a warning to notify that the discharge voltage is limited to $V_{max}$.

At step S150, when having determined that $V_{opt}<V_{max}$ holds or after step S154, the FL discharge voltage control unit 124 proceeds to step S156.

At step S156, the FL discharge voltage control unit 124 sets the discharge voltage of the flash lamp 92 to be $V_{opt}$. Since the light emission timing is changed when the discharge voltage is changed, the FL discharge voltage control unit 124 performs processing of correcting light emission timing change due to the discharge voltage of the flash lamp 92 at step S158. The FL discharge voltage control unit 124 corrects $T_{FL}$ based on $T_{FL}=T_{FL}+(dT_{FL}/dV)(V_{opt}-V_{curr})$. In the formula, "$dT_{FL}/dV$" is obtained from correlation information acquired through step S10 in FIG. 27. The "discharge voltage and optimum delay time correlation acquisition" processing indicated at step S10 in FIG. 27 acquires information necessary for the correction processing at step S158 in FIG. 28.

Figure 29:
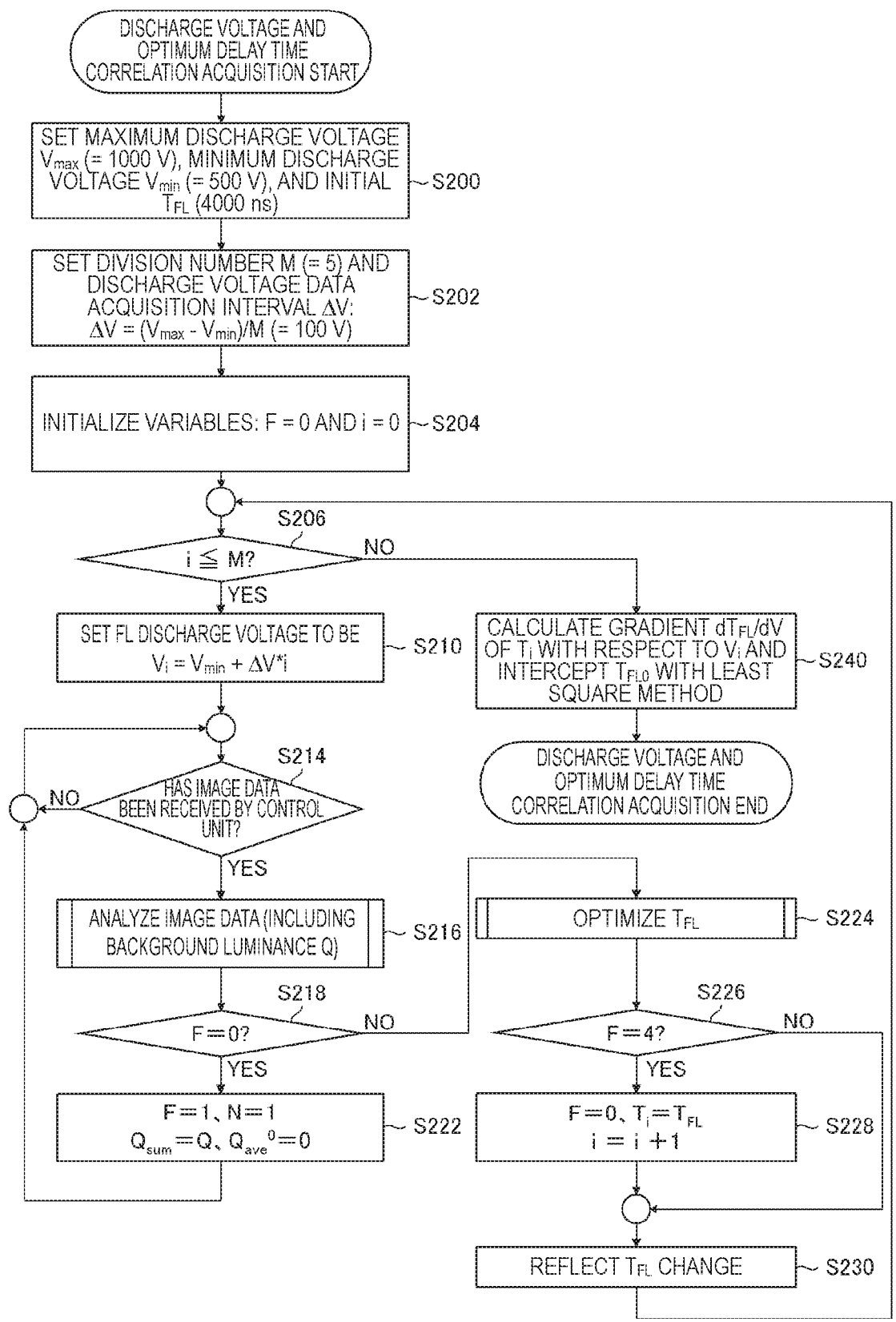
FIG. 29 is a flowchart illustrating the content of processing of acquiring a correlation between a discharge voltage and an optimum delay time.

FIG. 29 is a flowchart illustrating the content of the discharge voltage and optimum delay time correlation acquisition processing. Overview of the flowchart illustrated in FIG. 29 is described before detailed description of each step. The FL discharge voltage control unit 124 divides the range of the minimum discharge voltage $V_{min}$ to the maximum discharge voltage $V_{max}$ into M parts (steps S200 to S202), and calculates an optimum FL delay time (light emission peak timing) $T_i$ with each discharge voltage $V_i$ (i=0, 1, ..., M) (step S228). Thereafter, the FL discharge voltage control unit 124 generalizes the correlation between the discharge voltage and the optimum FL delay time as a linear function by a least square method (step S240).

The steps are sequentially described below. At step S200, the FL discharge voltage control unit 124 sets the maximum discharge voltage $V_{max}$, the minimum discharge voltage $V_{min}$, and initial $T_{FL}$. Specifically, the values are set as follows, for example. The maximum discharge voltage $V_{max}$ is set to be 1000 volts [V]. The minimum discharge voltage $V_{min}$ is set to be 500 volts [V]. The initial $T_{FL}$ is set to be 4000 nanoseconds [ns].

At step S202, the FL discharge voltage control unit 124 sets the division number M for the voltage range of the minimum discharge voltage $V_{min}$ to the maximum discharge voltage $V_{max}$. Specifically, the value M is set to be, for example, five. In addition, at step S202, the FL discharge voltage control unit 124 sets a discharge voltage data acquisition interval $\Delta V$. The FL discharge voltage control unit 124 sets the data acquisition interval $\Delta V$ in accordance with $\Delta V=(V_{max}-V_{min})/M$. The data acquisition interval $\Delta V$ is set to be 100 volts [V] in a case of $V_{max}=1000$ volts [V], $V_{min}=500$ volts [V], and the division number M=5.

At step S204, the FL discharge voltage control unit 124 initializes variables. Specifically, the FL discharge voltage control unit 124 initializes the adjustment flag F to be "0" and the discharge voltage index i to be zero.

Then, at step S206, the FL discharge voltage control unit 124 determines whether i is equal to or smaller than M. When having determined that i≤M holds at step S206, the FL discharge voltage control unit 124 proceeds to step S210.

At step S210, the FL discharge voltage control unit 124 sets the FL discharge voltage $V_i$ to be $V_{min}+\Delta V \times i$.

The following processing at the steps S214 to S230 is same as the processing at steps S14 to S30 described with reference to FIG. 17, and thus description thereof will be omitted.

When F=4 holds at step S226 in FIG. 29, the FL discharge voltage control unit 124 proceeds to step S228.

At step S228, the FL discharge voltage control unit 124 sets the adjustment flag F to be "0" and $T_i=T_{FL}$. Then, the FL discharge voltage control unit 124 increments i to set i+1 as new i.

The optimum FL delay time $T_i$ at each discharge voltage $V_i$ is obtained through the loop through steps S206 to S230.

When i exceeds M at step S206, the FL discharge voltage control unit 124 proceeds to step S240.

At step S240, the FL discharge voltage control unit 124 calculates the gradient $dT_{FL}/dV$ of $T_i$ with respect to $V_i$ and the intercept $T_{FLO}$ by the least square method based on the data ($V_i$ and $T_i$) for i=0 to M. In this manner, the correlation between the discharge voltage and the optimum FL delay time is generalized as a linear function.

Although the correlation between the discharge voltage and the optimum FL delay time can be determined through the flowchart illustrated in FIG. 29, the linear function representing the correlation between the discharge voltage and the optimum FL delay time may be obtained by performing the same measurement with the flash lamp by using a photodiode or the like in advance.

8.3 Effects

According to the second embodiment, in addition to the effects of the first embodiment, it is possible to reduce decrease of the background luminance of a captured image by adjusting the discharge voltage of the flash lamp upon decrease of the total light emission amount due to aging of the flash lamp. Accordingly, the background luminance can be maintained appropriately at the reference luminance.

9. Diffused Target Measurement

In the description of the first and second embodiments, the target image measurement device 90 captures an image of a target in the droplet form, but the target image measurement device 90 may capture an image of the target diffused after irradiated with a pre-pulse laser beam.

Figure 30:
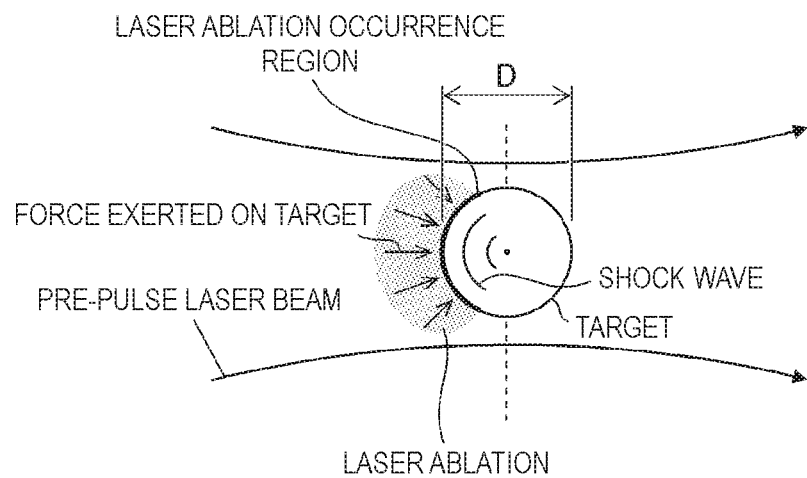
FIG. 30 is a diagram schematically illustrating an estimated state of a target when time in the order of picoseconds has elapsed since start of irradiation of the target with a pre-pulse laser beam having a pulse width in the order of picoseconds.
Figure 31:
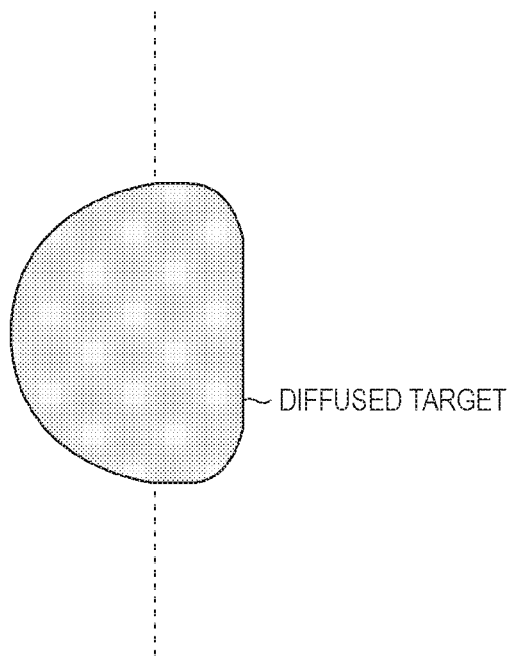
FIG. 31 is a diagram schematically illustrating an estimated state of a target when time in the order of nanoseconds has elapsed since start of irradiation of the target with a pre-pulse laser beam having a pulse width in the order of picoseconds.
Figure 32:
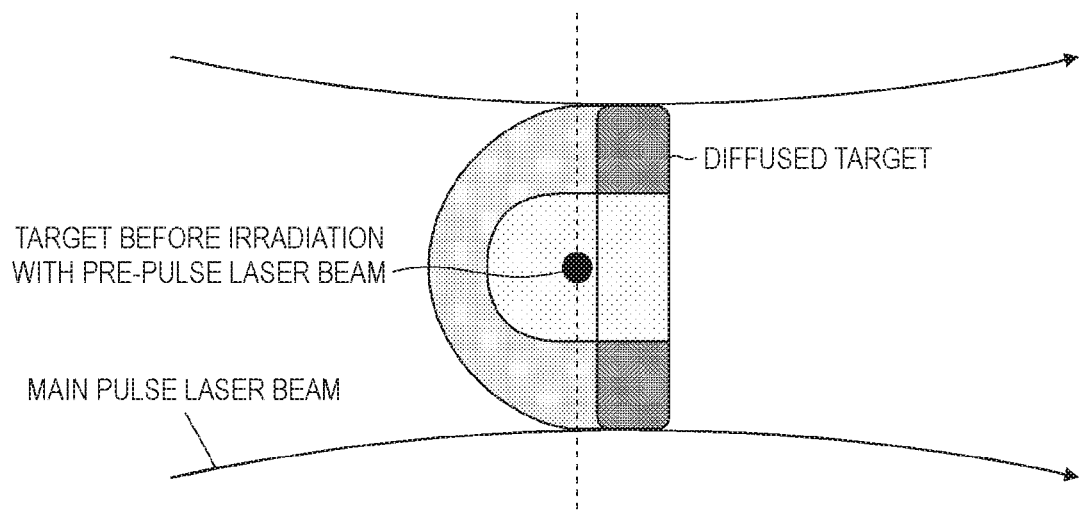
FIG. 32 is a diagram schematically illustrating the state of a diffused target when time of 1 μs approximately has elapsed since start of irradiation of the target with a pre-pulse laser beam having a pulse width in the order of picoseconds.

FIGS. 30 to 32 are cross-sectional views schematically illustrating the process of generation of a target diffused when irradiated with a pre-pulse laser beam having a pulse width in the order of picoseconds. FIG. 30 illustrates an estimated state of the target when time in the order of picoseconds has elapsed since the start of irradiation of the target with the pre-pulse laser beam having a pulse width in the order of picoseconds. FIG. 31 illustrates an estimated state of the target when time in the order of nanoseconds has elapsed since the start of irradiation of the target with the pre-pulse laser beam having a pulse width in the order of picoseconds. FIG. 32 illustrates the state of the diffused target when time of 1 μs approximately has elapsed since the start of irradiation of the target with the pre-pulse laser beam having a pulse width in the order of picoseconds.

As illustrated in FIG. 30, when the target in the droplet form is irradiated with the pre-pulse laser beam, part of the energy of the pre-pulse laser beam is absorbed by the surface of the target. As a result, laser ablation occurs that involves spread of ions, atoms, and the like moving substantially perpendicularly from the target surface irradiated the pre-pulse laser beam toward the outside of the target. Accordingly, reaction due to the laser ablation occurs perpendicularly to the target surface irradiated with the pre-pulse laser beam and inward the target.

The pre-pulse laser beam has a fluence equal to or higher than, for example, 6.5 J/cm², and completes the target irradiation in time in the order of picoseconds, and thus the energy of light incident on the target per time is large. Accordingly, strong laser ablation occurs in a short time. As a result, reaction due to the laser ablation is large, and thus it is presumed that shock wave occurs inside the target.

The shock wave travels substantially perpendicularly to the surface of the target irradiated with the pre-pulse laser beam, and thus converges to substantially the center of the target in the droplet form. The wavefront of the shock wave initially has a substantially hemispherical surface shape substantially parallel to the surface of the target. The energy concentrates as the shock wave converges, and when the concentrated energy exceeds a certain magnitude, breakdown of the target in the droplet form starts.

It is presumed that the target breakdown starts at the substantially hemispherical surface shaped wavefront of the shock wave, the energy of which exceeds the certain magnitude through the convergence. This is thought to be a reason for the diffusion of the target in a dome shape on the incident side of the pre-pulse laser beam as illustrated in FIGS. 31 and 32.

In FIG. 30, when the shock wave converges to the center of the target in the droplet form, the energy concentrates most, and breakdown occurs to the remaining part of the target at once. This is thought to be a reason for the diffusion of the target in an annular shape on the traveling direction side of the pre-pulse laser beam as illustrated in FIG. 32.

Although it is presumed that strong laser ablation occurs in FIG. 30, the laser ablation occurs in a short time, and it is presumed that the shock wave reaches the center of the target in a short time. Then, it is presumed that the target breakdown starts as illustrated in FIG. 31 when time in the order of nanoseconds has elapsed. This is presumed to be a reason that the barycenter of the target has hardly moved from a position before the irradiation with the pre-pulse laser beam as illustrated in FIG. 32.

In the EUV light generation device 12 described in the first and second embodiments, the diffused target can be measured by the target image measurement device 90 by appropriately setting the delay time of each of the drive laser output trigger, the image capturing trigger, the shutter trigger, and the FL trigger.

The above description is intended to provide not restriction but examples. Thus, the skilled person in the art would clearly understood that the embodiments of the present disclosure may be changed without departing from the scope of the claims.

Terms used throughout the present specification and the claims should be understood as non-limiting terms. For example, it should be understood that the terms "includes" and "included" mean that "the present invention is not limited to a subject described as being included". It should be understood that the term "has" means that "the present invention is not limited to a subject described as being had". It should be understood that the indefinite article "a" in the present specification and the claims means "at least one" or "one or more".

What is claimed is:

1. A target image capturing device comprising:
   a delay circuit configured to receive a timing signal from outside and output a first trigger signal at a timing delayed by a first delay time from the reception of the timing signal;
   an illumination light source configured to emit light based on the first trigger signal;
   an image capturing unit disposed to capture an image of a shadow of a target to be observed, which is generated when the target is irradiated with the light emitted from the illumination light source;
   a processing unit configured to perform image processing including processing of measuring a background luminance from the image obtained by capturing the image of the shadow of the target by the image capturing unit; and
   a control unit configured to perform control to adjust the first delay time based on the background luminance,
   wherein the target is tin, and
   the control unit performs control to adjust the first delay time when the background luminance measured by the processing unit is lower than an allowable lower limit luminance.

2. The target image capturing device according to claim 1, wherein a light emission port through which the light emitted from the illumination light source is emitted toward the target and a light incident port through which light having passed nearby the target is introduced to the image capturing unit are disposed at positions opposite to each other with respect to a position through which the target passes.

3. The target image capturing device according to claim 1, wherein
the image capturing unit includes an image sensor and a shutter,
the delay circuit outputs an image capturing trigger as a second trigger signal at a timing delayed by a second delay time from the reception of the timing signal, and outputs a shutter trigger as a third trigger signal at a timing delayed by a third delay time from the reception of the timing signal,
the image sensor performs image capturing based on the image capturing trigger, and
the shutter is opened and closed based on the shutter trigger.

4. The target image capturing device according to claim 1, wherein the control unit measures the background luminance with the first delay time set differently, and adjusts the first delay time so that the background luminance becomes highest.

5. The target image capturing device according to claim 1, wherein the processing unit performs, for each captured image acquired by the image capturing unit, target measurement processing of performing measurement to obtain information related to at least one of the position and shape of the target from the captured image, and processing of measuring the background luminance.

6. The target image capturing device according to claim 1, wherein
a reference luminance and an allowable variation width for the reference luminance are set in advance, and
the control unit performs control to adjust the first delay time when the background luminance measured by the processing unit is lower than the allowable lower limit luminance defined by the reference luminance and the allowable variation width.

7. The target image capturing device according to claim 1, wherein the control unit shortens the first delay time when the background luminance measured by the processing unit is lower than the allowable lower limit luminance.

8. The target image capturing device according to claim 1, wherein
the processing unit performs processing of calculating an average count value over the entire captured image based on a count value of each pixel of the captured image, and
the control unit acquires the average count value as the background luminance.

9. The target image capturing device according to claim 1, wherein
the processing unit performs processing of specifying a maximum count value in the entire captured image from a count value of each pixel of the captured image, and
the control unit acquires the maximum count value as the background luminance.

10. The target image capturing device according to claim 1, wherein
the processing unit performs processing of producing, based on a count value of each pixel of the captured image, a histogram of the count values in the entire captured image, and specifying a count value corresponding to a peak of the histogram, and
the control unit acquires the count value corresponding to the peak as the background luminance.

11. The target image capturing device according to claim 1, wherein
the processing unit performs processing of calculating an average count value in each of a plurality of measurement regions set in an image region of the captured image in advance, and calculating an average value of the calculated average count values of the measurement regions, and
the control unit acquires the average value as the background luminance.

12. The target image capturing device according to claim 1, wherein
the processing unit performs processing of excluding, from calculation, a measurement region including a shadow of the target among a plurality of measurement regions set in an image region of the captured image in advance, calculating an average count value in each remaining measurement region not including the shadow of the target, and calculating an average value of the calculated average count values of the measurement regions, and
the control unit acquires the average value as the background luminance.

13. The target image capturing device according to claim 1, wherein the illumination light source is a flash lamp.

14. The target image capturing device according to claim 13, further comprising a discharge voltage control unit configured to specify a discharge voltage of the flash lamp, wherein the discharge voltage control unit performs control to adjust the discharge voltage of the flash lamp based on the background luminance measured by the processing unit.

15. The target image capturing device according to claim 14, wherein
the discharge voltage control unit performs processing of determining, based on a current discharge voltage, the background luminance measured by the processing unit, and a predetermined reference luminance, an optimum discharge voltage with which the background luminance becomes equal to the reference luminance, and
the control unit corrects the first delay time based on the relation between the discharge voltage and an optimum delay time upon a change of setting of the discharge voltage by the discharge voltage control unit.

16. An extreme ultraviolet light generation device comprising:
a chamber in which plasma is generated;
a target supply unit configured to supply, into the chamber, a target from which the plasma is generated;
a target passing detection device configured to detect passing of the target supplied from the target supply unit into the chamber and output a target passing detection signal;
a delay circuit configured to receive the target passing detection signal and output a first trigger signal at a timing delayed by a first delay time from the reception of the target passing detection signal;
an illumination light source configured to emit light based on the first trigger signal;
an image capturing unit disposed at the chamber to capture an image of a shadow of the target to be observed, which is generated when the target is irradiated with the light emitted from the illumination light source;

a processing unit configured to perform image processing including processing of measuring a background luminance from the image obtained by capturing the image of the shadow of the target by the image capturing unit; and a control unit configured to perform control to adjust the first delay time based on the background luminance, the device generating extreme ultraviolet light by irradiating the target supplied from the target supply unit into the chamber with a laser beam to generate plasma from the target, and wherein the target is tin, and the control unit performs control to adjust the first delay time when the background luminance measured by the processing unit is lower than an allowable lower limit luminance.

17. The extreme ultraviolet light generation device according to claim 16, wherein the chamber includes a first window as a light emission port through which the light emitted from the illumination light source is emitted toward the target, and a second window as a light incident port through which light having passed nearby the target is introduced to the image capturing unit, and the first window and the second window are disposed at positions opposite to each other with respect to a position through which the target passes.

18. The target image capturing device according to claim 3, wherein the control unit measures the background luminance with the first delay time set differently, and adjusts the first delay time so that the background luminance becomes highest.

19. The target image capturing device according to claim 18, wherein a reference luminance and an allowable variation width for the reference luminance are set in advance, and the control unit performs control to adjust the first delay time when the background luminance measured by the processing unit is lower than the allowable lower limit luminance defined by the reference luminance and the allowable variation width.

20. The target image capturing device according to claim 18, wherein the control unit adjusts the first delay time in a state where the third delay time is maintained.

* * * * *